(12) United States Patent
Ching et al.

(10) Patent No.: US 10,777,554 B2
(45) Date of Patent: *Sep. 15, 2020

(54) SEMICONDUCTOR DEVICE AND FABRICATING THE SAME

(71) Applicant: Taiwan Semiconductor Manufacturing Company, Ltd., Hsin-Chu (TW)

(72) Inventors: Kuo-Cheng Ching, Hsinchu County (TW); Ting-Hung Hsu, Miaoli (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 98 days.

This patent is subject to a terminal disclaimer.

(21) Appl. No.: 15/645,352

(22) Filed: Jul. 10, 2017

(65) Prior Publication Data

US 2017/0309629 A1 Oct. 26, 2017

Related U.S. Application Data

(60) Continuation of application No. 14/712,705, filed on May 14, 2015, now Pat. No. 9,704,861, which is a
(Continued)

(51) Int. Cl.
| | |
|---|---|
| *H01L 27/092* | (2006.01) |
| *H01L 29/66* | (2006.01) |
| *H01L 29/775* | (2006.01) |
| *H01L 21/8238* | (2006.01) |
| *H01L 21/84* | (2006.01) |

(Continued)

(52) U.S. Cl.
CPC .... *H01L 27/092* (2013.01); *H01L 21/823821* (2013.01); *H01L 21/84* (2013.01); *H01L 21/845* (2013.01); *H01L 27/1203* (2013.01); *H01L 29/1033* (2013.01); *H01L 29/42392* (2013.01); *H01L 29/66439* (2013.01); *H01L 29/775* (2013.01); *H01L 29/7853* (2013.01); *H01L 29/0673* (2013.01); *H01L 29/513* (2013.01)

(58) Field of Classification Search
CPC ........... H01L 27/092; H01L 21/823821; H01L 21/84; H01L 21/845; H01L 27/1203; H01L 29/1033; H01L 29/42392; H01L 29/66439; H01L 29/775; H01L 29/7853; H01L 29/0673; H01L 29/513
USPC .......................................................... 257/9
See application file for complete search history.

(56) References Cited

U.S. PATENT DOCUMENTS

| | | |
|---|---|---|
| 7,354,831 B2 | 4/2008 | Orlowski |
| 7,611,938 B2 | 11/2009 | Cheng et al. |

(Continued)

FOREIGN PATENT DOCUMENTS

| | | |
|---|---|---|
| CN | 101894842 | 11/2010 |
| KR | 20090042590 | 4/2009 |

(Continued)

*Primary Examiner* — Dzung Tran
(74) *Attorney, Agent, or Firm* — Haynes & Boone, LLP

(57) ABSTRACT

An integrated circuit (IC) device comprises a substrate having a metal-oxide-semiconductor (MOS) region; a gate region disposed over the substrate and in the MOS region; and source/drain features in the MOS region and separated by the gate region. The gate region includes a fin structure and a nanowire over the fin structure. The nanowire extends from the source feature to the drain feature.

20 Claims, 26 Drawing Sheets

Related U.S. Application Data division of application No. 13/957,102, filed on Aug. 1, 2013, now Pat. No. 9,035,277.

(51) Int. Cl.
*H01L 27/12* (2006.01)
*H01L 29/423* (2006.01)
*H01L 29/10* (2006.01)
*H01L 29/78* (2006.01)
H01L 29/51 (2006.01)
H01L 29/06 (2006.01)

(56) References Cited

U.S. PATENT DOCUMENTS

| | | | |
|---|---|---|---|
| 7,663,166 | B2 | 2/2010 | Kim et al. |
| 7,759,737 | B2 | 7/2010 | Cho et al. |
| 8,084,308 | B2 | 12/2011 | Chang et al. |
| 8,455,334 | B2 | 6/2013 | Bangsaruntip et al. |
| 8,658,518 | B1 | 2/2014 | Chang et al. |
| 8,722,492 | B2 | 5/2014 | Bangsaruntip et al. |
| 8,753,942 | B2 | 6/2014 | Kuhn et al. |
| 8,759,875 | B1 | 6/2014 | Zheng et al. |
| 8,987,748 | B2 | 3/2015 | Pal et al. |
| 9,035,277 | B2 | 5/2015 | Ching et al. |
| 2001/0025997 | A1 | 10/2001 | Onishi |
| 2004/0063286 | A1* | 4/2004 | Kim .................. H01L 21/82341 438/283 |
| 2005/0136585 | A1* | 6/2005 | Chau ..................... B82Y 10/00 438/214 |
| 2005/0266645 | A1* | 12/2005 | Park ..................... H01L 29/1033 438/282 |
| 2005/0269629 | A1 | 12/2005 | Lee et al. |
| 2006/0240622 | A1 | 10/2006 | Lee et al. |
| 2007/0004124 | A1 | 1/2007 | Suk et al. |
| 2007/0017439 | A1 | 1/2007 | Xianyu et al. |
| 2008/0017934 | A1* | 1/2008 | Kim ..................... H01L 29/0657 257/401 |
| 2008/0093699 | A1 | 4/2008 | Abe et al. |
| 2008/0237684 | A1* | 10/2008 | Specht ............. H01L 21/28282 257/316 |
| 2009/0170251 | A1* | 7/2009 | Jin ......................... B82Y 10/00 438/197 |
| 2010/0295021 | A1* | 11/2010 | Chang ................. H01L 27/1203 257/24 |
| 2010/0297816 | A1 | 11/2010 | Bedell et al. |
| 2011/0008937 | A1 | 1/2011 | Jin et al. |
| 2011/0147697 | A1 | 6/2011 | Shah et al. |
| 2011/0168982 | A1 | 7/2011 | Bangsaruntip et al. |
| 2012/0138886 | A1* | 6/2012 | Kuhn ..................... B82Y 10/00 257/9 |
| 2013/0161639 | A1 | 6/2013 | Pal et al. |
| 2014/0197377 | A1 | 7/2014 | Kim et al. |
| 2016/0303197 | A1 | 10/2016 | Ching et al. |

FOREIGN PATENT DOCUMENTS

| | | |
|---|---|---|
| TW | 201115734 | 5/2011 |
| TW | 201225172 | 6/2012 |
| WO | WO2012074872 | 6/2012 |
| WO | WO2013095646 | 6/2013 |

* cited by examiner

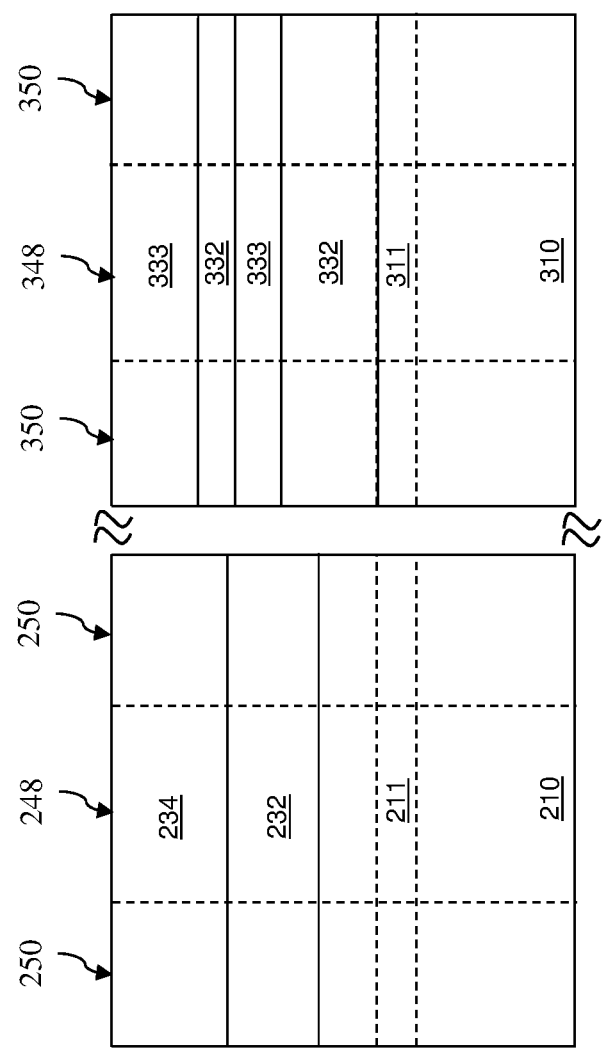

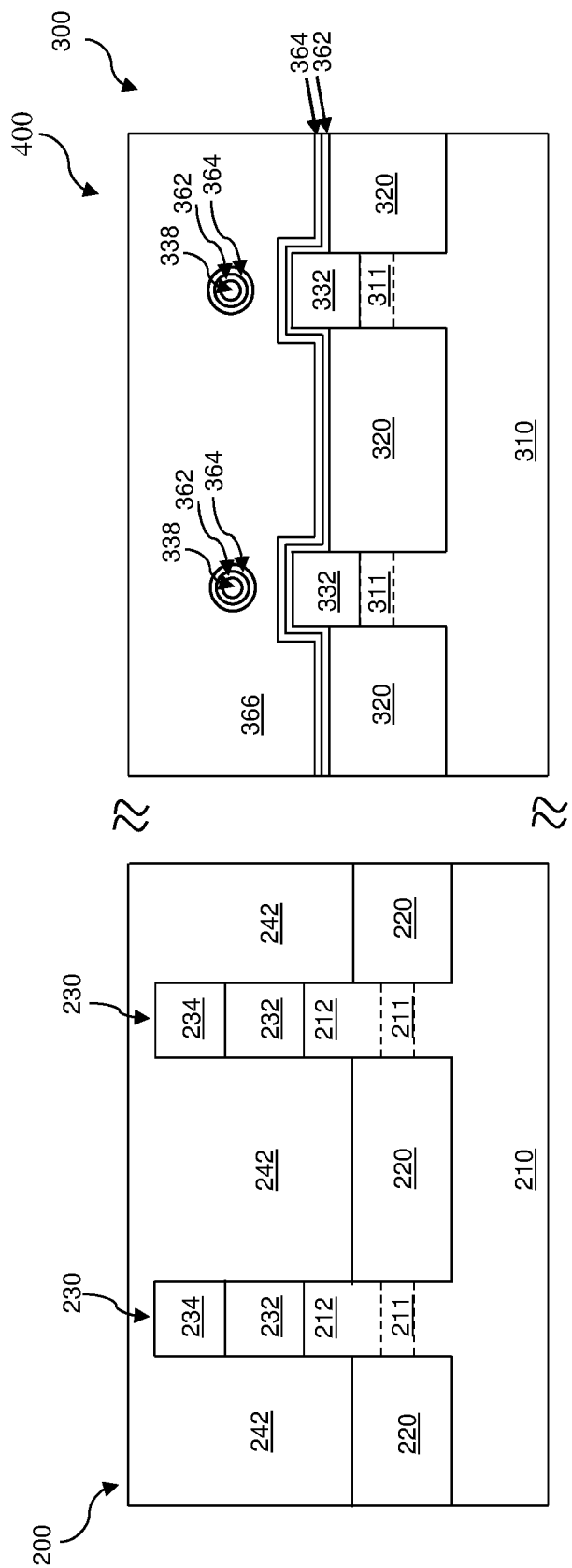

SEMICONDUCTOR DEVICE AND FABRICATING THE SAME

PRIORITY DATA

The present application is a continuation application of U.S. application Ser. No. 14/712,705, filed on May 14, 2015, which is a divisional application of U.S. application Ser. No. 13/957,102, filed on Aug. 1, 2013," each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a semiconductor device with nanowires, has been introduced to replace a planar transistor. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-14A are cross-sectional views of the NMOS region and the PMOS region of the IC device along the line A-A in FIG. 2 at various fabrication stages constructed according to the method of FIG. 1.

FIGS. 3B-14B are cross-sectional views of the NMOS region and the PMOS region of the IC device along the line B-B in FIG. 2 at various fabrication stages constructed according to the method of FIG. 1.

DETAILED DESCRIPTION

Figure 1:
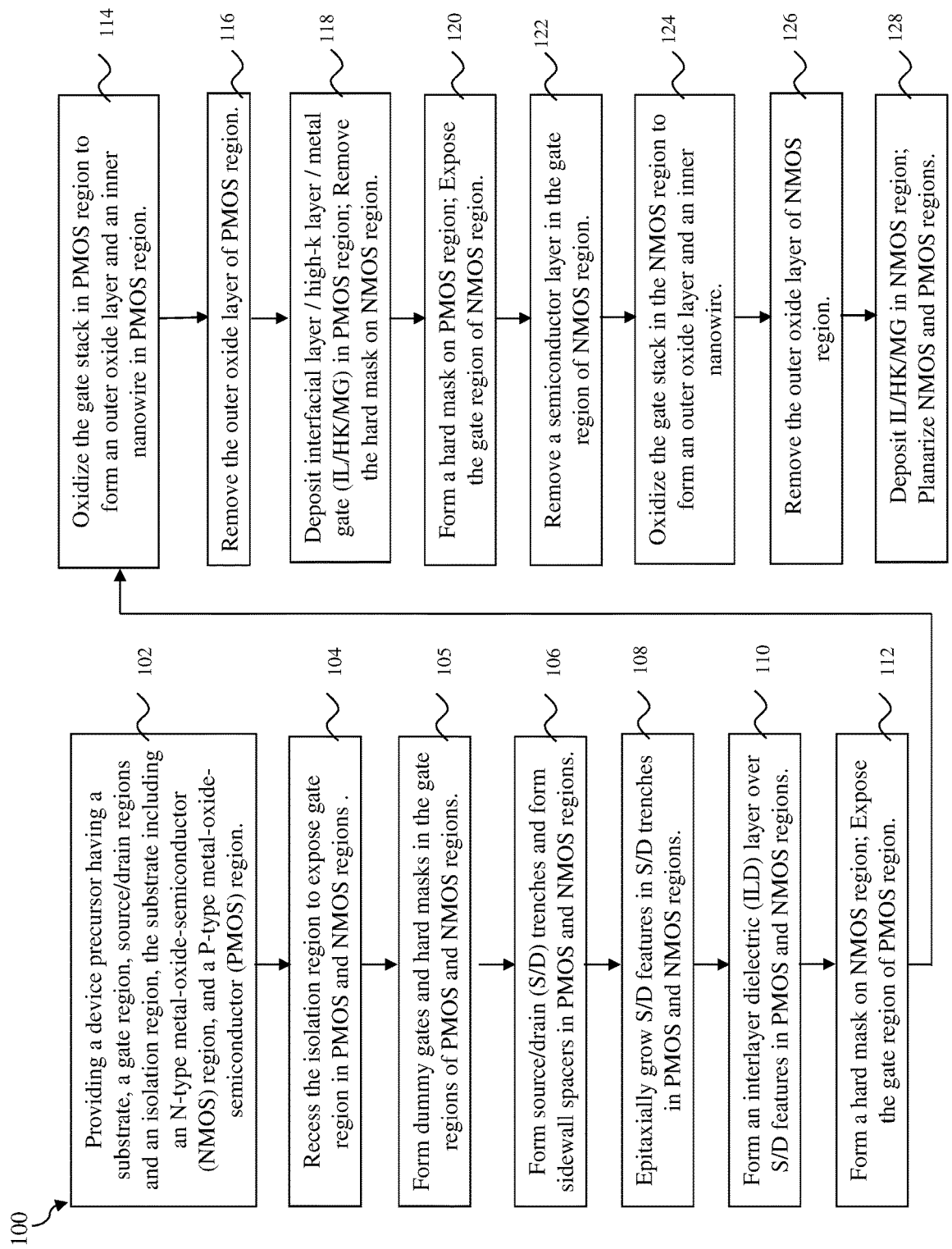
FIG. 1 is a flow chart of an example method for fabricating an N-type metal-oxide-semiconductor (NMOS) region and a P-type metal-oxide-semiconductor (PMOS) region in an integrated circuit (IC) device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a complementary metal-oxide-semiconductor (CMOS) device comprising a P-type metal-oxide-semiconductor (PMOS) device and an N-type metal-oxide-semiconductor (NMOS) device. The following disclosure will continue with a CMOS device example to illustrate various embodiments of the present invention. It is understood, however, that the present disclosure should not be limited to a particular type of device, except as specifically claimed. It is also understood that additional steps can be provided before, during, and after the method, and some of the steps described can be replaced or eliminated for other embodiments of the method.

Figure 2:
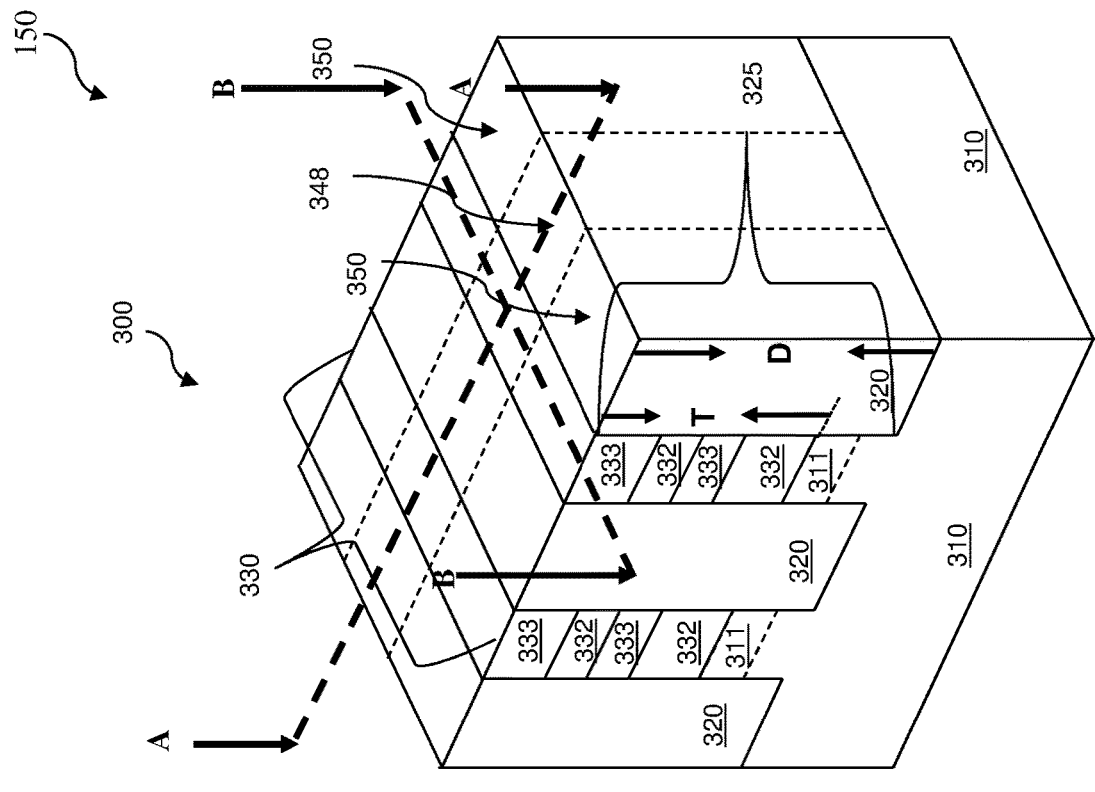
FIG. 2 is a diagrammatic perspective view of an NMOS region and a PMOS region of a device precursor according to some embodiments of the present disclosure.
Figure 2:
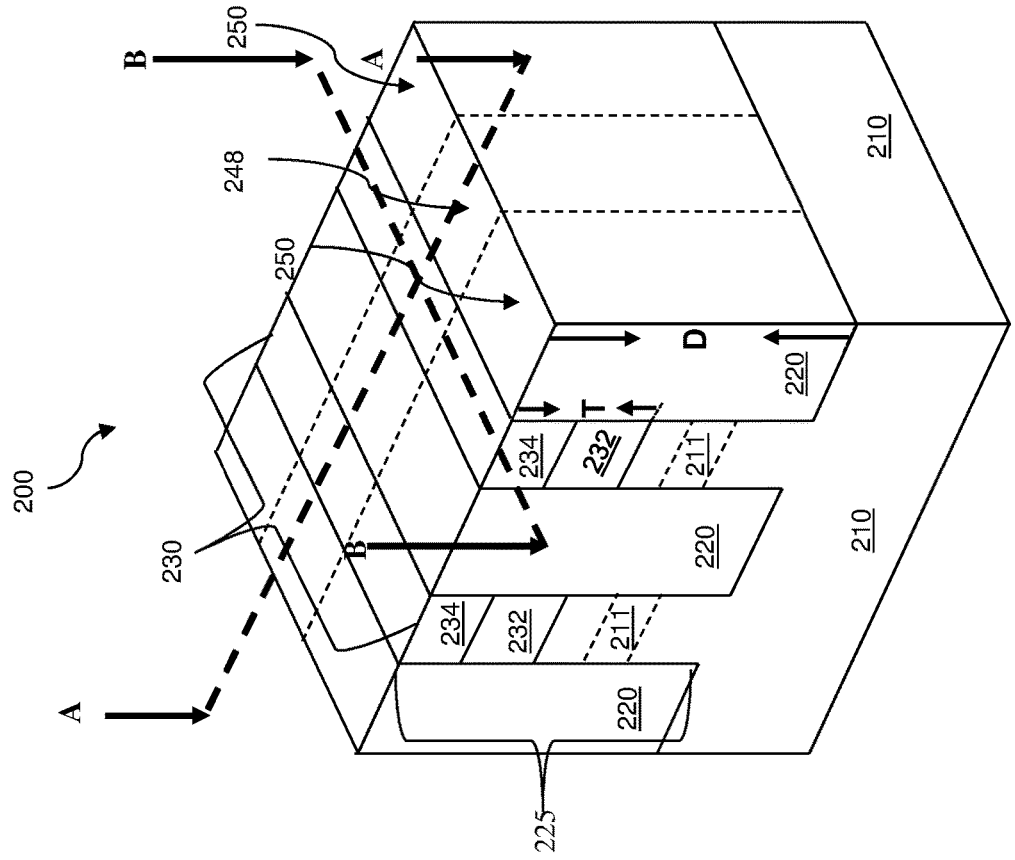

FIG. 1 is a flow chart of a method 100 for fabricating an NMOS region and a PMOS region in an IC device. Each of the regions may include a nanowire according to various aspects of the present disclosure. FIG. 2 provides diagrammatic perspective views of an example device precursor 150 having an NMOS region 200 and a PMOS region 300. Although the two regions 200, 300 are shown as being separate in the figure, it is understood that in the present embodiment, the regions can be part of a single IC device. Also, some device may include one region and not the other. FIGS. 3A-14A are cross-sectional views of the NMOS region 200 and the PMOS 300 along the lines A-A in FIG. 2 at various fabrication stages constructed according to the method 100 of FIG. 1. FIGS. 3B-14B are cross-sectional views of the NMOS region 200 and the PMOS 300 along the lines B-B in FIG. 2 at various fabrication stages constructed according to the method 100 of FIG. 1.

Referring to FIGS. 1 and 2, the method 100 begins at step 102 by providing the device precursor 150 including the NMOS region 200 and/or the PMOS region 300. NMOS region 200 includes a substrate 210. PMOS region 300 includes a substrate 310. In the present embodiment, substrates 210 and 310 are part of a common bulk silicon substrate. Alternatively, an elementary semiconductor, such as silicon or germanium in a crystalline structure, may also be included in substrate 210 and/or 310. NMOS region 200 and/or PMOS region 300 may also include a compound semiconductor, such as silicon germanium, silicon carbide, gallium arsenic, gallium phosphide, indium phosphide, indium arsenide, and/or indium antimonide; or combinations thereof. Possible substrates 210 and/or 310 also include a semiconductor-on-insulator substrate, such as silicon-on-insulator (SOI), SiGe-On-Insulator (SGOI), Ge-On-Insulator substrates. For example, SOI substrates may be fabricated using separation by implantation of oxygen (SIMOX), wafer bonding, and/or other suitable methods.

Various doped regions may also be included in substrate 210 and/or 310 depending on design requirements. The doped regions may be doped with p-type dopants, such as boron or BF2. The doped regions may also be doped with n-type dopants, such as phosphorus or arsenic. The doped regions may also be doped with combinations of p-type and n-type dopants. The doped regions may be formed directly on substrate 210 and/or 310, in a P-well structure, in an N-well structure, in a dual-well structure, or using a raised structure.

A first anti-punch through (APT) region 211 may be formed in the upper portion of substrate 210 and below semiconductor layer stack 230. The first APT region 211 may be formed to prevent the device punch-through issue. In some examples, the first APT region 211 in substrate 210 may be doped with p-type dopants, such as boron and/or $BF_2$.

A second APT region 311 may also be formed in the upper portion of substrate 310 and below semiconductor layer stack 330. The second APT region 31 may be formed to prevent the device punch-through issue. In some examples, the second APT region 311 in substrate 310 may be doped with n-type dopants, such as phosphorus and/or arsenic.

Still referring to FIG. 2, NMOS region 200 may also include one or more isolation regions 220. Isolation regions 220 are formed over the substrate 210 to isolate semiconductor layer stacks 230 from each other. PMOS region 300 may include one or more isolation regions 320. Isolation regions 320 are formed over the substrate 310 to isolate semiconductor layer stacks 330 from each other. Isolation regions 220 and/or 320 may be formed using traditional isolation technology, such as shallow trench isolation (STI), to define and electrically isolate the semiconductor layer stacks. In some examples, isolation regions 220 and/or 320 may include silicon oxide, silicon nitride, silicon oxynitride, an air gap, other suitable materials, or combinations thereof. Isolation regions 220 and/or 320 may be formed by any suitable process. In some examples, the formation of an STI includes a photolithography process, etching a trench in substrate 210 and/or 310 (for example, by using a dry etching and/or wet etching) to expose a fin structure 225 and/or 325, and filling the trench (for example, by using a chemical vapor deposition process) with one or more dielectric materials to form isolation regions 220 and/or 320. In some examples, the filled trench may have a multi-layer structure such as a thermal oxide liner layer filled with silicon nitride or silicon oxide. In some embodiments, a chemical mechanical polishing (CMP) process is performed to remove excessive dielectric materials and planarize the top surface of the isolation regions. In some embodiments, a depth (D) of isolation regions 220 and/or 320 may be in the range of 60-120 nm.

Still referring to FIG. 2, NMOS region 200 includes one or more semiconductor layer stacks 230 formed over substrate 210. PMOS region 300 may include one or more semiconductor layer stacks 330 formed over substrate 310. The formation process of semiconductor layer stacks 230 and/or 330 may include photolithography and etch processes on fin structure 225 and/or 325. The photolithography process may include forming a photoresist layer (resist) overlying the substrate, exposing the resist to a pattern, performing a post-exposure bake process, and developing the resist to form a masking element including the resist. Fin structure 225 and/or 325 may be recessed using the masking element by any appropriate dry etching and/or wet etching method. Semiconductor layer stacks 230 and/or 330 may be epitaxially grown after the recessing processes. In some embodiments, the thickness (T) of the recessed portions of substrate 210 and/or 310 may be in the range of 50-110 nm. In some examples, semiconductor layer stacks 230 and/or 330 are formed by patterning and etching a portion of fin structure 225 and/or 325. Alternatively, semiconductor layer stacks 230 and/or 330 may be formed by patterning and etching a silicon layer deposited overlying an insulator layer (for example, an upper silicon layer of a silicon-insulator-silicon stack of an SOI substrate.

As shown in FIG. 2, semiconductor layer stacks 230 and/or 330 may include multiple semiconductor layers. Each of the semiconductor layers may have substantial different thickness to each other. Semiconductor layer stacks 230 and/or 330 may include germanium (Ge), silicon (Si), gallium arsenide (GaAs), silicon germanium (SiGe), gallium arsenide phosphide (GaAsP), or other suitable materials. Semiconductor layer stacks 230 and/or 330 may be deposited by epitaxial growing processes, such as chemical vapor deposition (CVD), Vapor Phase Epitaxy (VPE), ultra high vacuum (UHV)-CVD, molecular beam epitaxy (MBE), and/or other suitable processes. The surface of NMOS region 200 and/or PMOS region 300 including the semiconductor layer stacks 230 and/or 330 may be then planarized using a CMP process.

Referring to the NMOS region 200 of FIG. 2, semiconductor layer stacks 230 include a first layer 232 formed over substrate 210, and a second layer 234 formed over the first layer 232. In some examples, the first layer 232 may include silicon germanium (SiGe). The second layer 234 may include silicon (Si). In some examples, the first layer (SiGe) 232 may have a thickness range of 5-15 nm. The percentage of germanium (Ge) in the SiGe may be in the range of 20-50%.

Referring to the PMOS region 300 of FIG. 2, semiconductor layer stacks 330 include one or more first layers 332 and one or more second layers 333 alternatingly stacked over each other. In some embodiments, the first layers 332 may include SiGe, and the second layers 333 may include Si. In some embodiments, semiconductor layer stacks 330 may include an alternating structure as SiGe (332)/Si (333)/SiGe (332)/Si (333) from bottom to top. The thickness of the one or more first layers 332 may be different from each. In some examples as shown in FIG. 2, the thickness of the upper first layer 332 may have a thickness in the range of 5-15 nm. The thickness of the lower first layer 332 may have a thickness in the range of 15-40 nm. In some embodiments, the percentage of Ge in the first layers SiGe 332 may be in the range of 20-65%. In some embodiments, the concentration of Ge in the first layers SiGe 332 may be different in some layers from others. In some examples, semiconductor layer stacks 330 may include more than two kinds of semiconductor layers stacking over each other. In some embodiments, the percentage of Ge in the upper first layers SiGe 332 may be higher than that in the lower first layer SiGe 332. In some examples, the percentage of Ge in the upper first layers SiGe 332 may be in the range of 45%-65%. In some examples, the percentage of Ge in the lower first layer SiGe 332 may be in the range of 30%-60%.

In the NMOS region 200, substrate 210 includes a source/drain region 250 and a gate region 248. The source/drain regions 250 are separated by gate region 248. In the PMOS region 300, substrate 310 includes a source/drain region 350 and a gate region 348. The source/drain regions 350 are separated by gate region 348.

In some embodiments, NMOS region 200 and PMOS region 300 of semiconductor precursor 150 may be formed in separate processes. For example, a first hard mask (not shown) may be formed over the surface of PMOS region 300 to prevent PMOS region 300 from being affected during the process of NMOS region 200. After the semiconductor layer stacks 230 are formed in NMOS region 200, a second hard mask (not shown) may be then formed over the surface of NMOS region 200 while PMOS region 300 is being processed. In some embodiments, NMOS region 200 may be first covered with a hard mask, and semiconductor layer stacks 330 in PMOS region 300 may be formed prior to forming semiconductor layer stacks 230 in NMOS region 200. The hard masks may include silicon oxide, silicon nitride, silicon oxynitride, or any other suitable dielectric material. The hard masks may be a single layer or multiple layers. The hard masks may be formed by CVD, atomic layer deposition (ALD), or any other appropriate method.

Figure 3A:
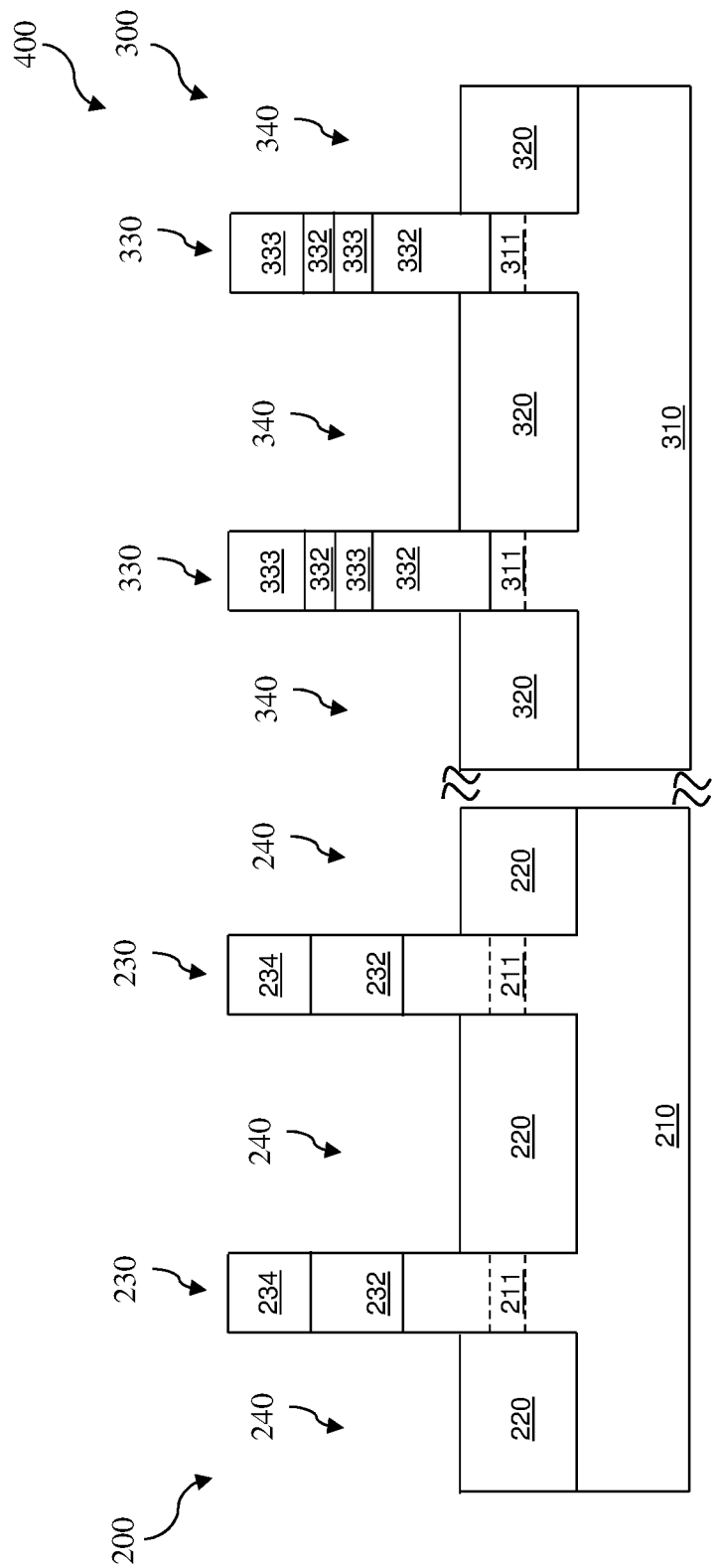

Referring to FIGS. 1 and 3A-3B, method 100 proceeds to step 104 by recessing portions of isolation regions 220 to form recessing trenches 240 to laterally expose semiconductor layer stacks 230 in NMOS region 200. It is noted that the following discussion will now refer to device precursor 150 (FIG. 2) as an IC device 400. At step 104, portions of isolation regions 320 may be recessed to form recessing trenches 340 to laterally expose semiconductor layer stacks 330 in PMOS region 300.

Still referring to FIGS. 3A-3B, the recessing process may include a dry etching process, a wet etching process, and/or combination thereof. The recessing process may include a selective wet etch or a selective dry etch.

Figure 4A:
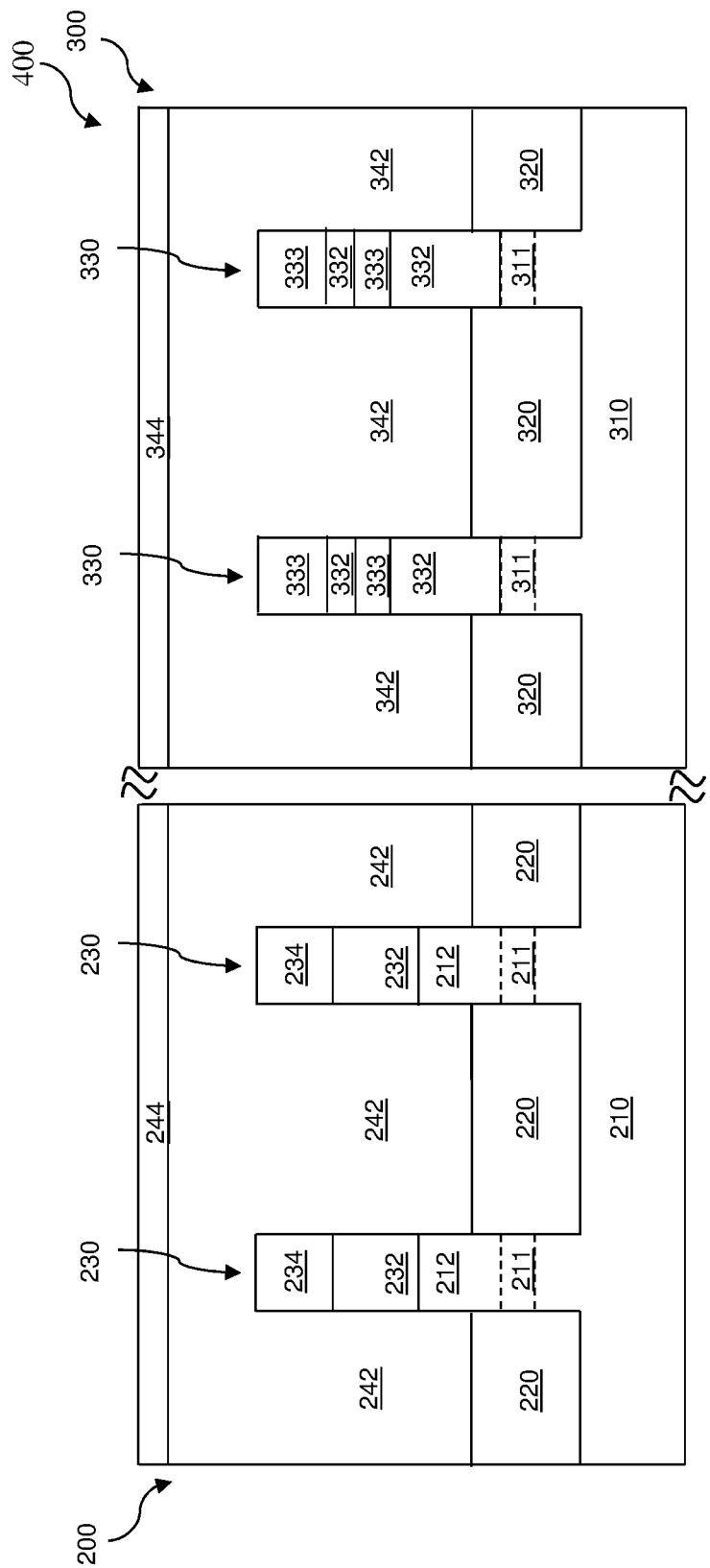
Figure 4B:
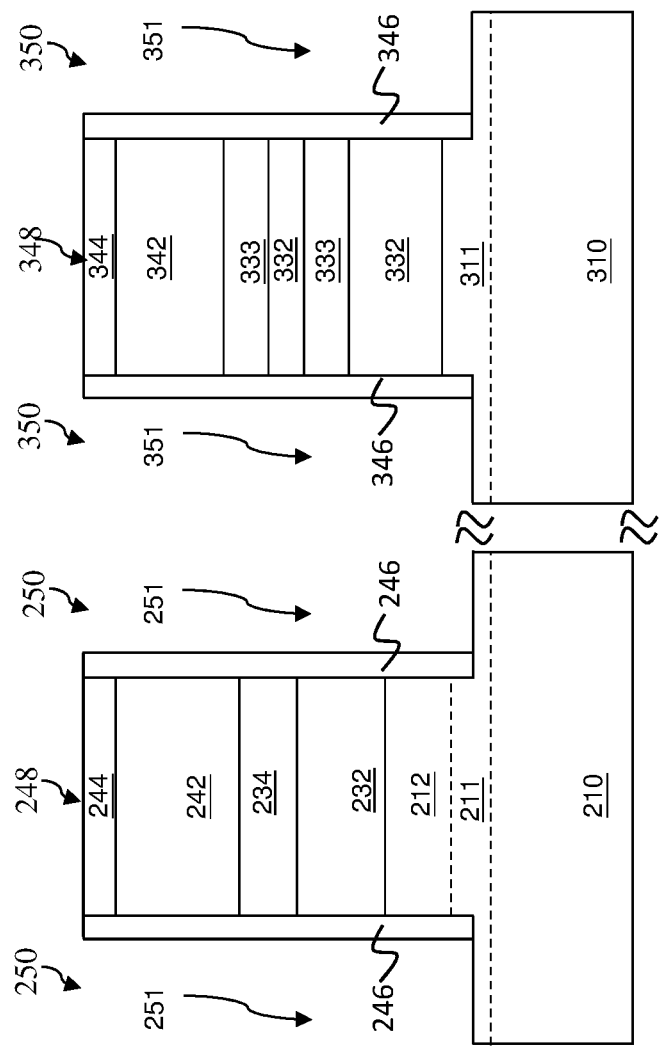

Referring to FIGS. 1 and 4A-4B, method 100 proceeds to step 105 by forming a dummy gate 242 and a hard mask 244 in gate region 248. Dummy gate 242 and hard mask 244 may be formed over the semiconductor layer stacks 230 and isolation regions 220 in gate region 248. At step 105, a dummy gate 342 and a hard mask 344 may be formed in gate region 348. Dummy gate 342 and hard mask 344 may be formed over the semiconductor layer stacks 330 and isolation regions 320 in gate region 348. Dummy gates 242 and/or 342, and hard masks 244 and/or 344 may be formed to protect gate regions 248 and/or 348 from being etched in the following source/drain recessing process. Dummy gates 242 and/or 342 may include polysilicon. The dummy gate 242 and/or 342 may be formed by any suitable process or processes. For example, the dummy gate 242 and/or 342 may be formed by a procedure including depositing, photolithography patterning, and/or etching processes. The deposition processes include CVD, PVD, ALD, other suitable methods, and/or combinations thereof. Hard masks 244 and/or 344 may include silicon oxide, silicon nitride, silicon oxynitride, or any other suitable dielectric material. The hard masks may be a single layer or multiple layers. Hard masks 244 and/or 344 may be formed by thermal oxidation, chemical oxidation, ALD, or any other appropriate method.

Referring to FIGS. 1 and 4A-4B, method 100 proceeds to step 106 by forming source/drain recessing trenches 251 in NMOS region 200. At step 106, source/drain recessing trenches 351 may be formed in PMOS region 300.

Referring to FIG. 4B, source/drain recessing trenches 251 may be formed by etching upper portion of source/drain region 250 in NMOS 200 using dummy gate 242 and hard mask 244. Source/drain recessing trenches 351 may be formed by etching upper portion of source/drain region 350 in PMOS 300 using dummy gate 342 and hard mask 344. Source/drain recessing trenches 251 and/or 351 may be formed using any kind of dry etching process, wet etching process, and/or appropriate combination thereof. Gate region 248 can be exposed between two adjacent source/drain recessing trenches 251 after the etching process. Gate region 348 can be exposed between two adjacent source/drain recessing trenches 351 after the etching process. In some embodiments, the upper portion of the substrate 210 may be etched during the etching process to form a fin structure 212. In some embodiments, the lower first layer 332 may be entirely or partially exposed after the etching process to form a fin structure 332. In some embodiments, the thickness of the fin structure 212 and/or 332 may be in the range of 15-40 nm.

Still referring to FIG. 4B, sidewall spacers 246 may be formed along gate region 248. Sidewall spacers 346 may be formed along gate region 348. Sidewall spacers 246 and/or 346 may include a dielectric material such as silicon oxide, silicon nitride, silicon carbide, silicon oxynitride, or combinations thereof. Sidewall spacers 246 and/or 346 may also include a multiple layers. Typical formation methods for the sidewall spacers include depositing a dielectric material over gate region 248 and/or 348. The dielectric material may be then anisotropically etched back. The etching back process may include a multiple-step etching to gain etch selectivity, flexibility and desired overetch control.

Figure 5A:
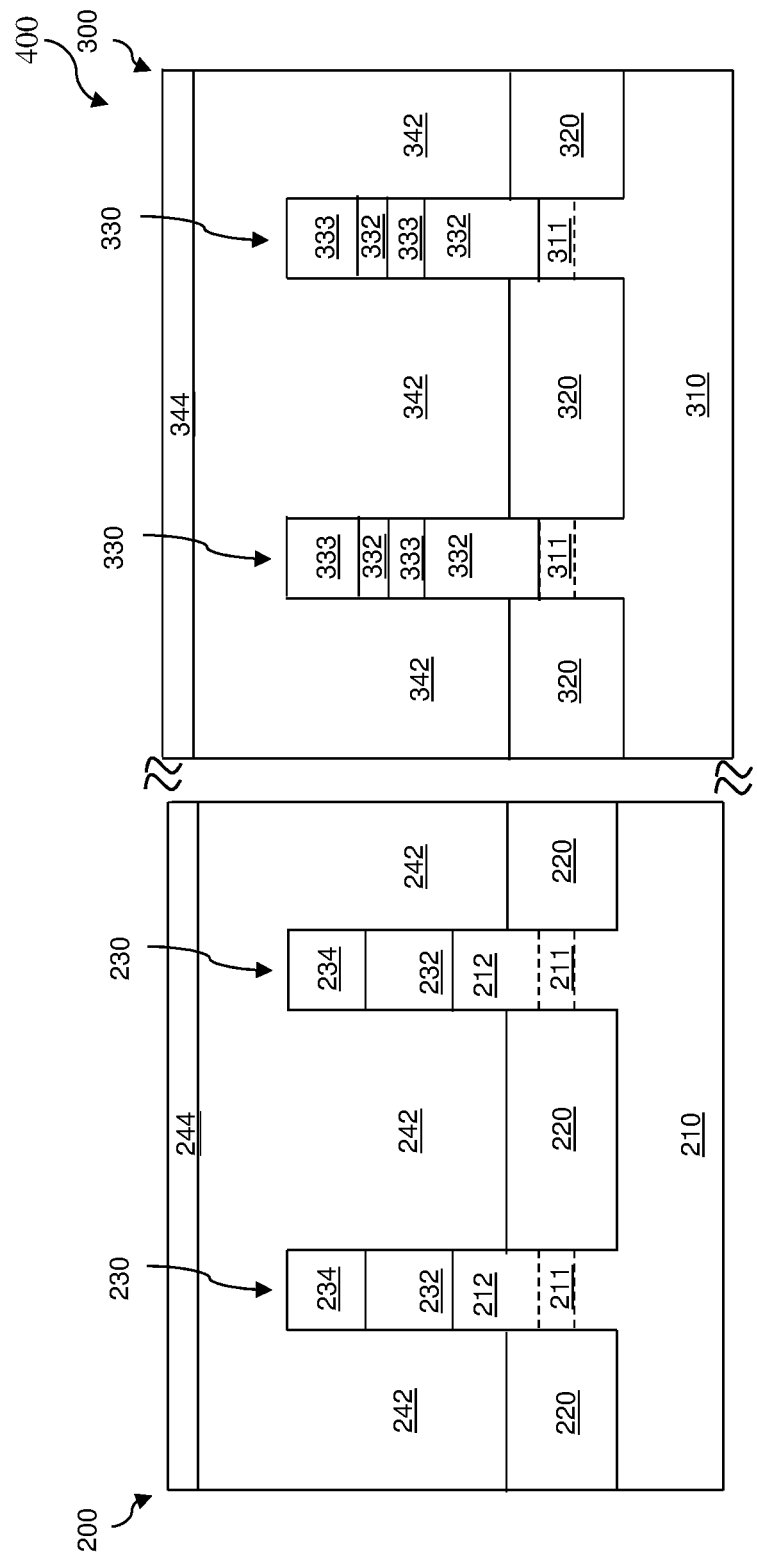
Figure 5B:
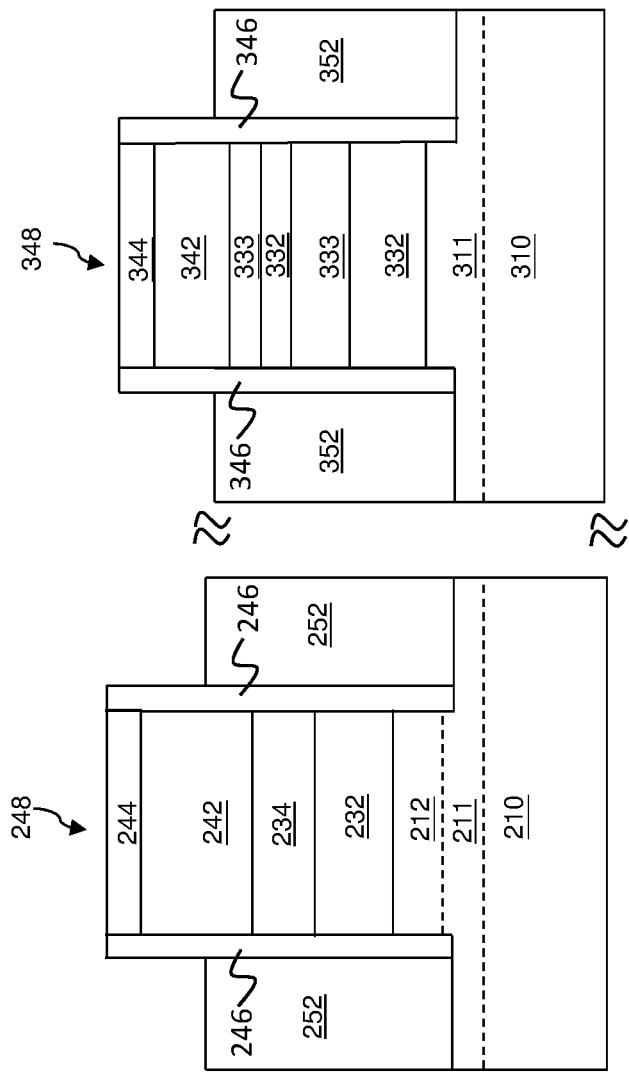

Referring to FIGS. 1 and 5A-5B, method 100 proceeds to step 108 by forming source/drain features 252 and/or 352 in the source/drain recessing trenches 251 and/or 351. In some examples, source/drain features 252 and/or 352 may be formed by epitaxially growing a semiconductor material layer in the source/drain recessing trenches 251 and/or 351. The formation processes and materials used to form the semiconductor material layer may be substantially similar to the formation processes and materials used to form semiconductor layer stacks 230 and/or 330, as described in FIG. 2. In some examples, source/drain features 252 and/or 352 may be formed by one or more epitaxial processes. Source/drain features 252 and/or 352 may be in-situ doped during the epitaxial process. For example, the epitaxially grown SiGe source/drain features may be doped with boron; and the epitaxially grown Si epitaxial source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, an implantation process (i.e., a junction implant process) may be performed to dope the source/drain features. One or more annealing processes may be performed to activate source/drain epitaxial feature. The annealing processes may comprise rapid thermal annealing (RTA) and/or laser annealing processes. In some embodiments, a source/drain feature is a source region, and the other source/drain feature is a drain region. Source/drain features 252 and/or 352 are separated by gate region 248 and/or 348.

Figure 6A:
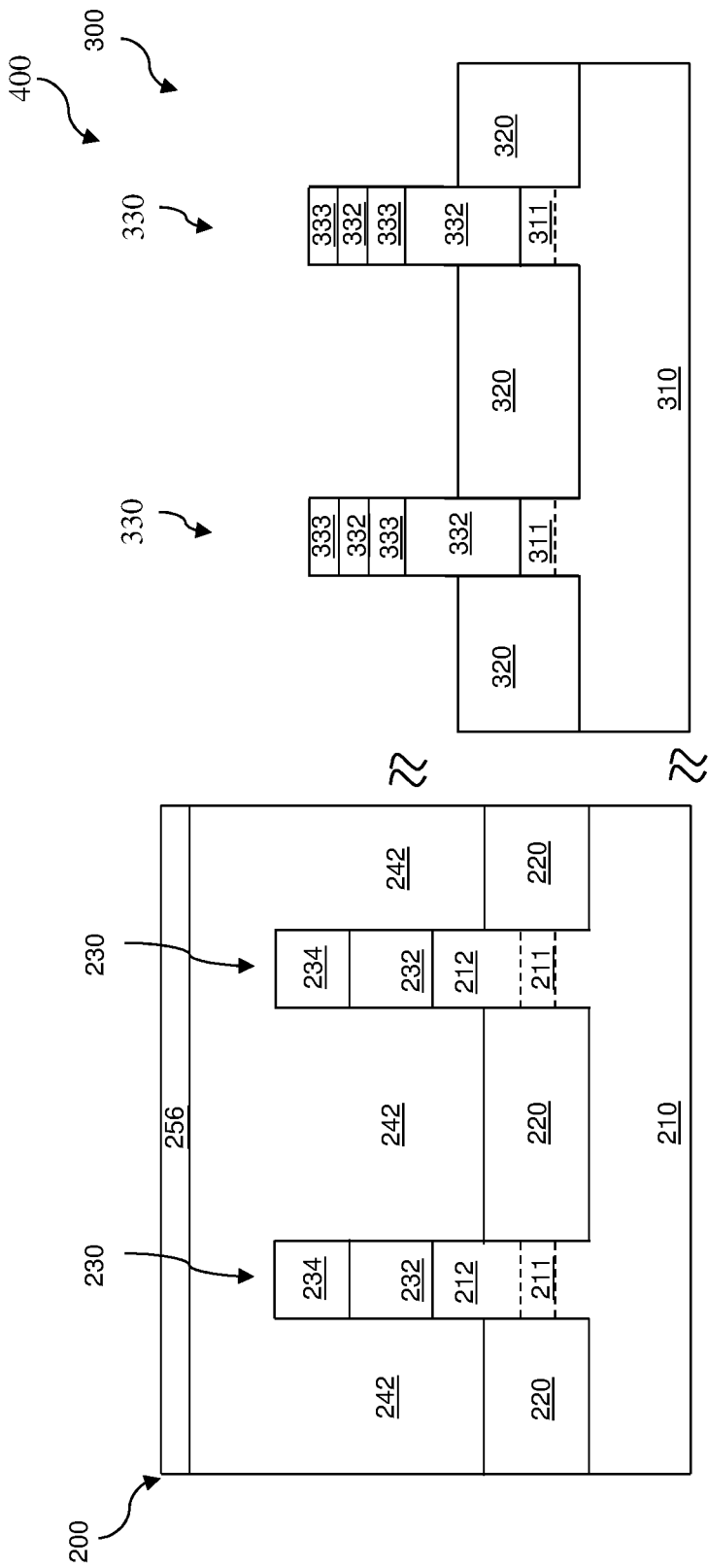
Figure 6B:
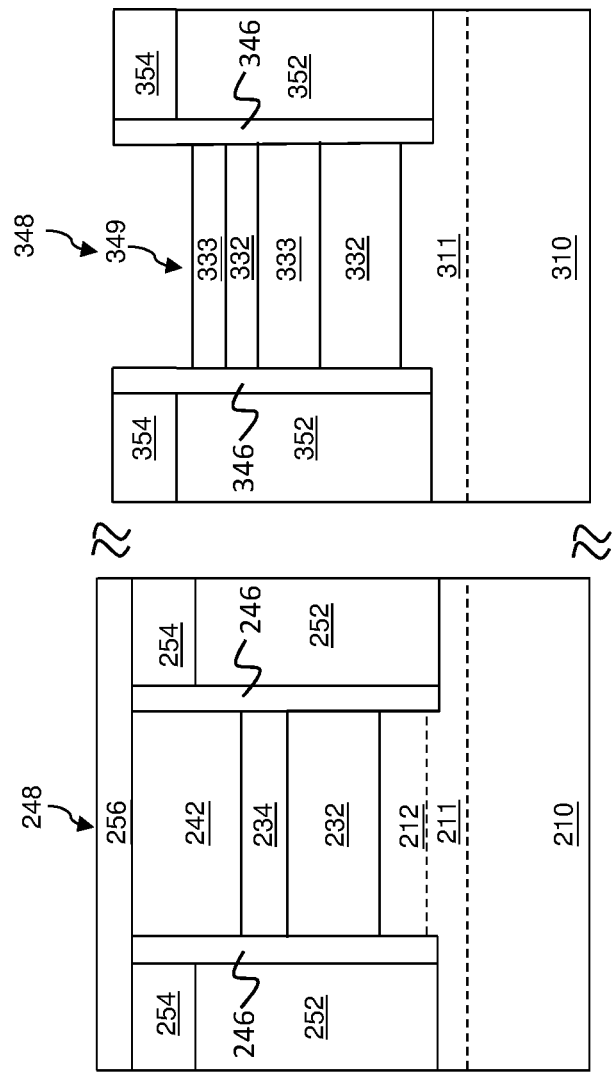

Referring to FIGS. 1 and 6A-6B, method 100 proceeds to step 110 by forming an interlayer dielectric (ILD) layer 254 over source/drain features 252 in NMOS region 200, and forming an ILD layer 352 over source/drain features 352 in PMOS region 300. ILD layers 254 and/or 354 may include silicon oxide, oxynitride or other suitable materials. ILD layers 254 and/or 354 may include a single layer or multiple layers. ILD layers 254 and/or 354 may be formed by a suitable technique, such as CVD, ALD and spin-on (e.g. spin-on dielectric such as spin-on glass (SOG)). After forming ILD layers 254 and/or 354 over the in the NMOS region 200 and/or PMOS region 300, CMP processes may be performed to remove excessive ILD layers 254 and/or 354 and planarize the top surface of ILD layers 254 and/or 354. In some embodiments, hard mask 244 of the NMOS region 200 and/or hard mask 344 of the PMOS region 300 may also be removed during the CMP processes as shown in FIGS. 6A-6B.

Referring to FIGS. 1 and 6A-6B, method 100 proceeds to step 112 by forming a patterned hard mask 256 to cover the NMOS region 200. At step 112, gate stack 349 of PMOS region 300 is also exposed. After removing excessive ILD layers 254 and/or 354 and planarizing the surface of NMOS region 200 and/or PMOS region at step 110, the surface of the NMOS region 200 may be covered with a patterned hard mask 256 to prevent NMOS region 200 from being affected during the following processes of PMOS region 300. Hard mask 256 may include silicon oxide, silicon nitride, silicon oxynitride, or any other suitable dielectric material. Hard mask 256 may include a single layer or multiple layers. Hard mask 256 may be formed by CVD, ALD, or any other appropriate method.

Still referring to FIGS. 6A-6B, at step 112, gate stack 349 in gate region 348 of PMOS region 300 may be exposed by removing dummy gate 342. Gate stack 349 may include one or more first layers 332 and one or more second layers 333 alternatingly stacked over each other. Dummy gate 342 may be removed using any appropriate method, such as etching processes. The etching processes may include selective wet etch or selective dry etch, such that dummy gate 342 has an adequate etch selectivity with respect to the gate stack 349, and the sidewall spacers 346. Alternatively, dummy gate 342 may be recessed by a series of processes including photolithography patterning and etching back.

Figure 7A:
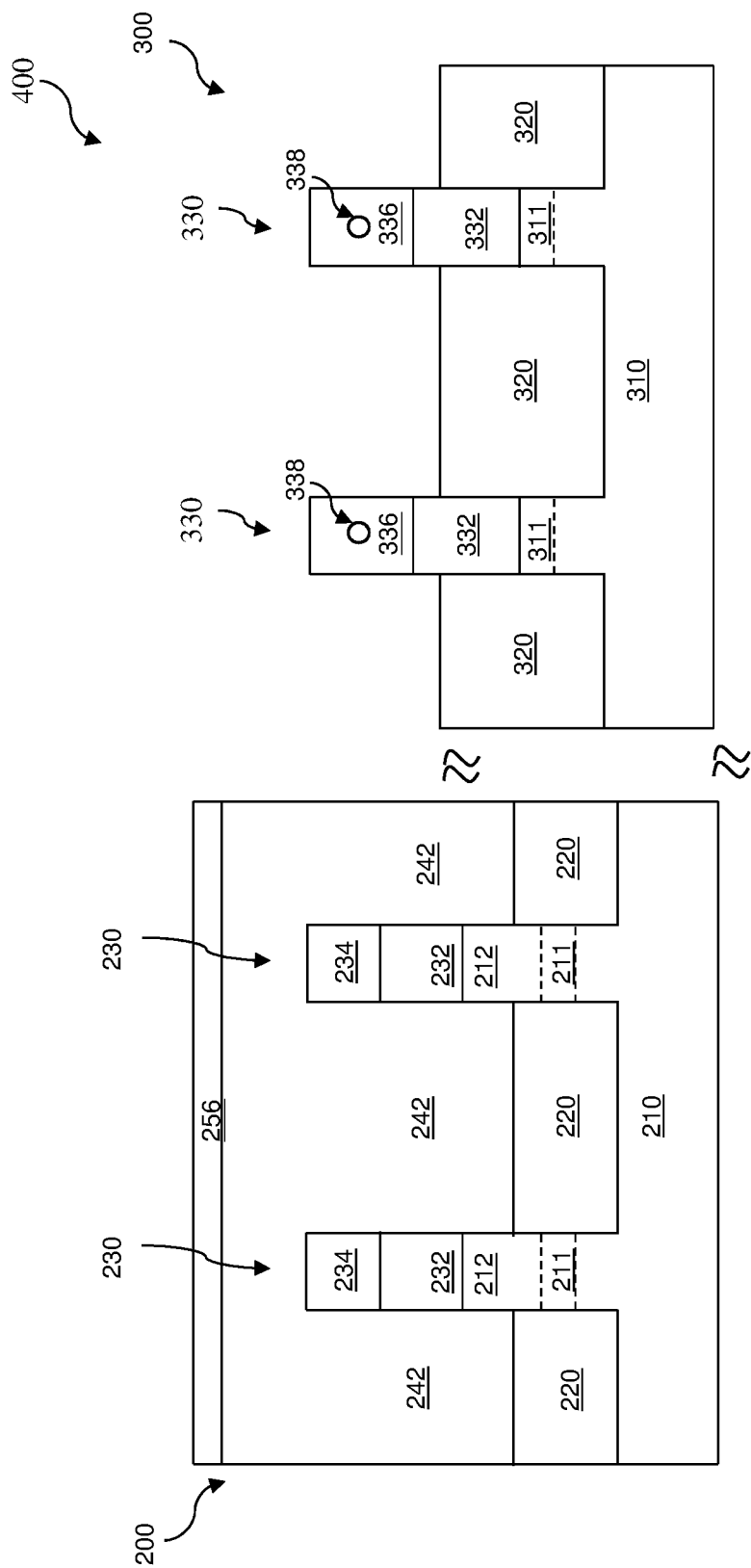
Figure 7B:
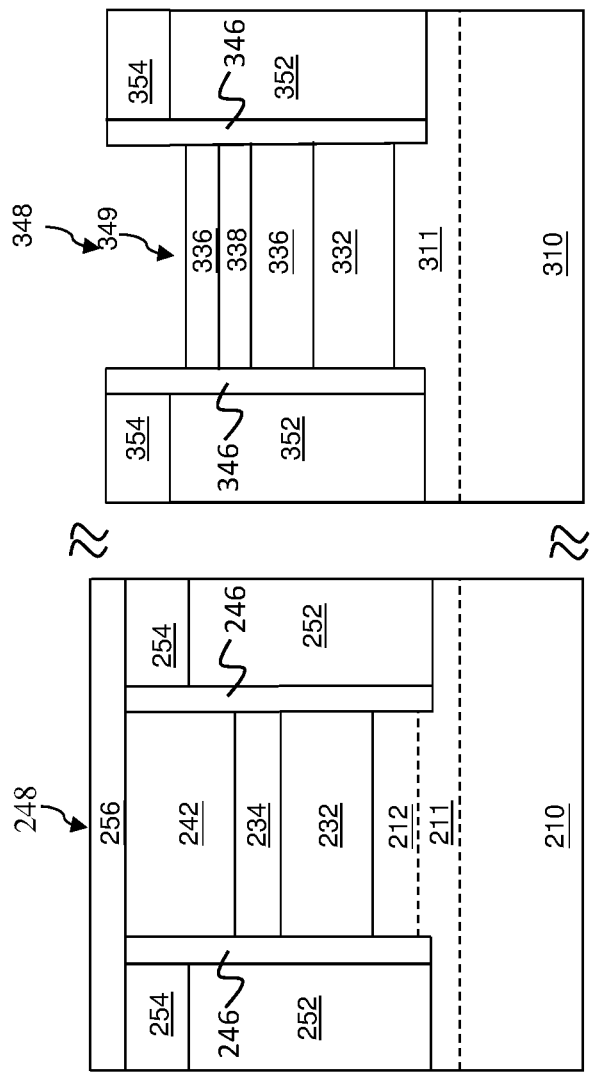

Referring to FIGS. 1 and 7A-7B, method 100 proceeds to step 114 by oxidizing portions of the gate stack 349 in gate region 348 in PMOS region 300 to form an outer oxide layer 336 and an inner nanowire 338. In some embodiments, a thermal oxidation process may be performed on the second layers 333 and the upper first layer 332 of gate stack 349. In some examples, the thermal oxidation process is conducted in oxygen ambient. In some examples, the thermal oxidation process may be conducted in a combination of steam ambient and oxygen ambient. The thermal oxidation process may be conducted in a combination of steam ambient and oxygen ambient with one atmospheric pressure and a temperature in a range from 400° C. to 600° C. The thermal oxidation process may be conducted for 30-180 minutes. During the thermal oxidation process, the second layers 333, and an element of the upper first layer 332 are oxidized to form an outer oxide layer 336. In some embodiments, outer semiconductor oxide layer 336 may include silicon oxide (SiOx), where x is oxygen composition in atomic percent. In some embodiments, another element of the upper first layer 332 may diffuse to the center of the upper portion of gate stack 349 to form a semiconductor core portion 338 during the oxidation process. Semiconductor core portion 338 may be formed continuously along the line B-B, and connected to the source/drain features 352 on both sides of gate stack 349. It is noted that the following discussion will now refer to semiconductor core portion 338 as an inner semiconductor nanowire 338. In some embodiments, the inner semiconductor nanowire 338 may be Ge nanowire 338. The outer semiconductor oxide layer 336 may be formed to wrap the inner semiconductor nanowire 338.

Referring to FIGS. 7A-7B, in some examples, the diameter of the inner semiconductor nanowire 338 may be in the range of 2-15 nm. The size and shape of outer oxide layer 336 and/or inner semiconductor nanowire 338 may vary with different process conditions, such as thermal oxidation temperature and time.

Figure 8A:
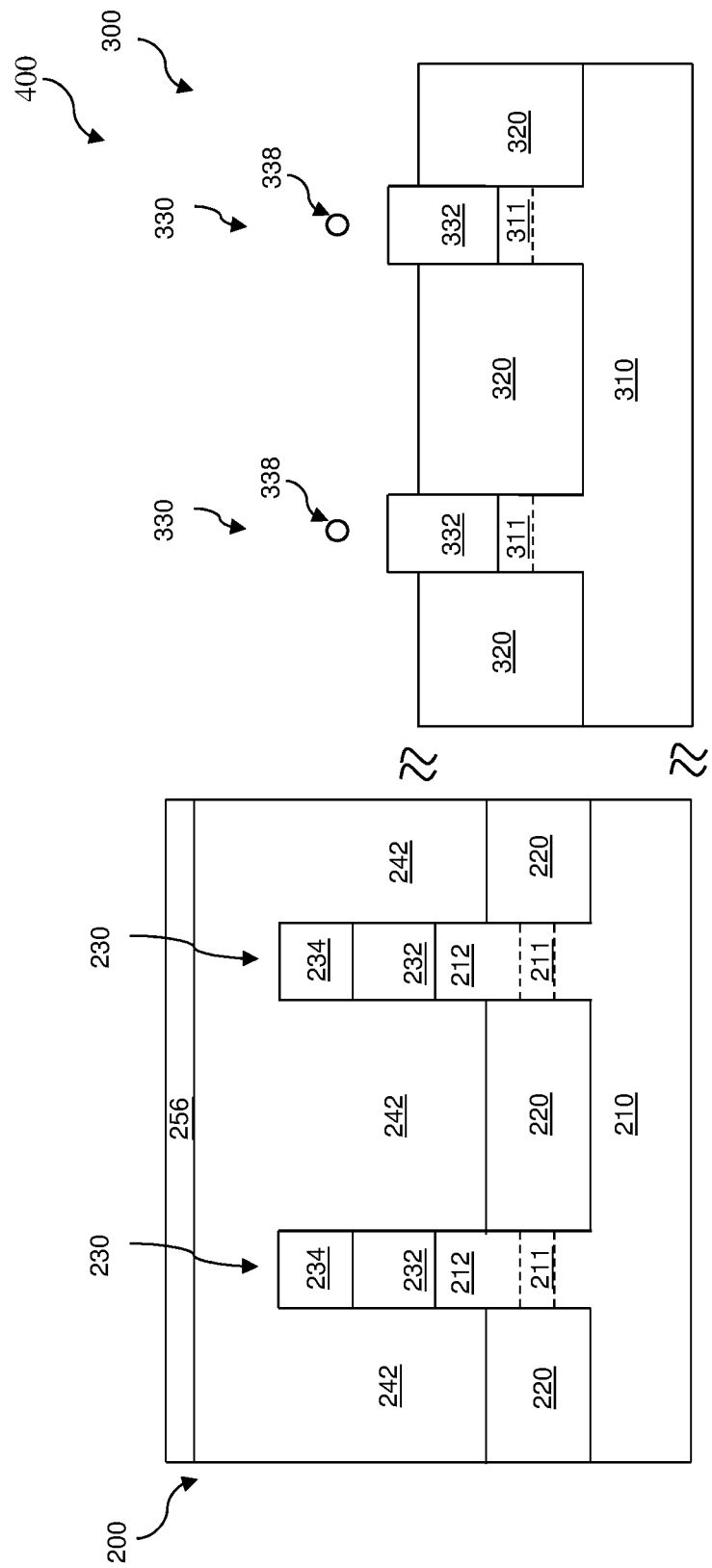
Figure 8B:
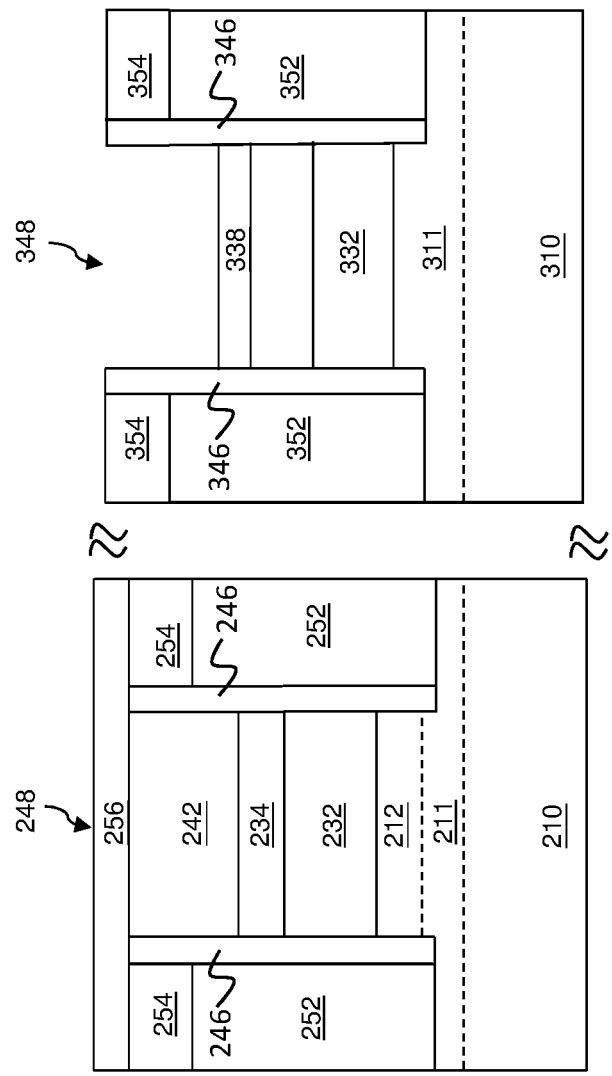

Referring to FIGS. 1 and 8A-8B, method 100 proceeds to step 116 by removing outer oxide layer 336 to expose inner nanowire 338 in PMOS region 300. The removing process may include a dry etch, a wet etch, or a combination of. For example, a selective wet etch or a selective dry etch of outer semiconductor oxide layer 336 is performed with adequate etch selectivity with respect to semiconductor nanowire 338. After removing outer oxide layer 336, gate region 348 of the PMOS region 300 is configured to include inner nanowire 338 and fin structure 332. In some embodiments, fin structure 332 may be the entire or an upper portion the first semiconductor layer 332.

Figure 9B:
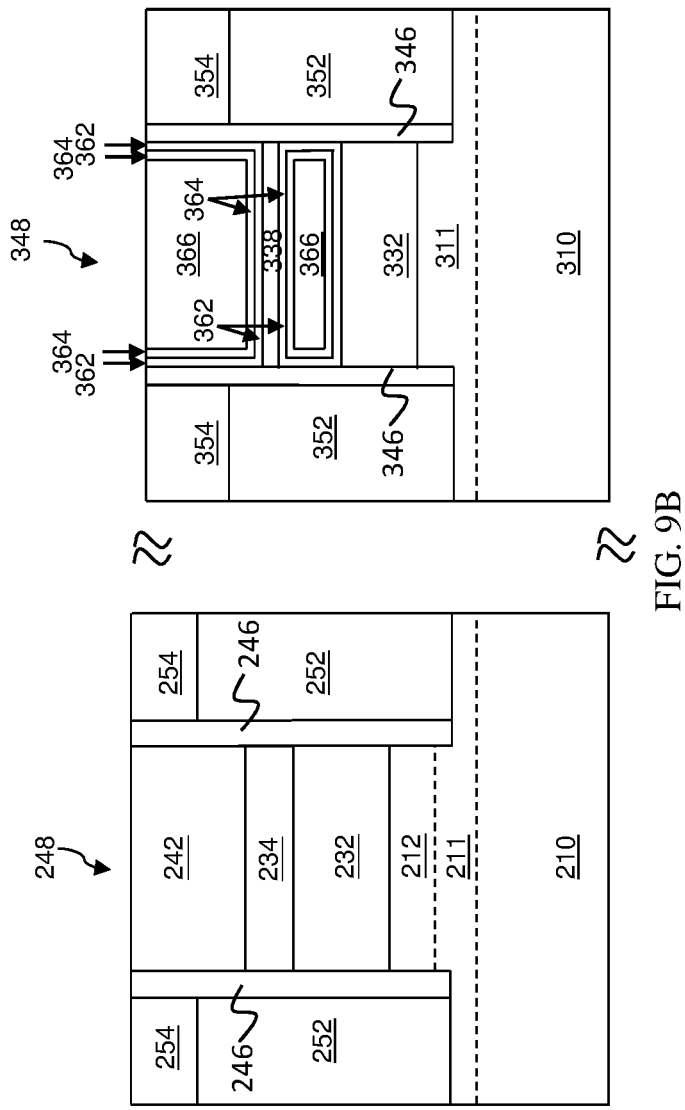

Referring to FIGS. 1 and 9A-9B, method 100 proceeds to step 118 by forming interfacial layer (IL) 362/high-k (HK) dielectric layer 364/metal gate (MG) 366 in PMOS region 300. In some embodiments, an IL 362 may be formed to wrap around inner nanowire 338, and cover the fin structure 332 and sidewall spacers 346. IL 362 may be deposited by any appropriate method, such as ALD, chemical vapor deposition CVD and ozone oxidation. IL 362 may include oxide, HfSiO and oxynitride. In some embodiments, the interface between the isolation region 320 and the IL 362 may not be observed after the thermal treatment. A HK dielectric layer 364 is deposited over and wrapping around IL 362 by any suitable techniques, such as ALD, CVD, metal-organic CVD (MOCVD), physical vapor deposition (PVD), thermal oxidation, combinations thereof, or other suitable techniques. HK dielectric layer 364 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. In some embodiments, the interface between the IL 362 and the HK dielectric layer 364 may not be observed after the thermal treatment.

An MG layer 366 may include a single layer or multi layers, such as metal layer, liner layer, wetting layer, and adhesion layer. MG layer 366 may include Ti, Ag, Al, TiAlN, TaC, TaCN, TaSiN, Mn, Zr, TiN, TaN, Ru, Mo, Al, WN, Cu, W, or any suitable materials. MG layer 366 may be formed by ALD, PVD, CVD, or other suitable process. A CMP process may be performed to remove excessive MG layer 366. The CMP process provides a substantially planar top surface for gate region 348 as well as ILD layers 354 in PMOS region 300. After depositing IL 362/HK layer 364/ MG 366, gate region 348 may include fin structure 332, semiconductor nanowire 338, and IL 362/HK layer 364/MG 366 as shown in FIG. 9B.

Referring to FIGS. 9A-9B, in some embodiments at step 118, hard mask 256 over the NMOS region 200 may be removed during the planarization of the surface of PMOS region 300 using a CMP process. Hard mask 256 may be removed using a CMP process.

Figure 10A:
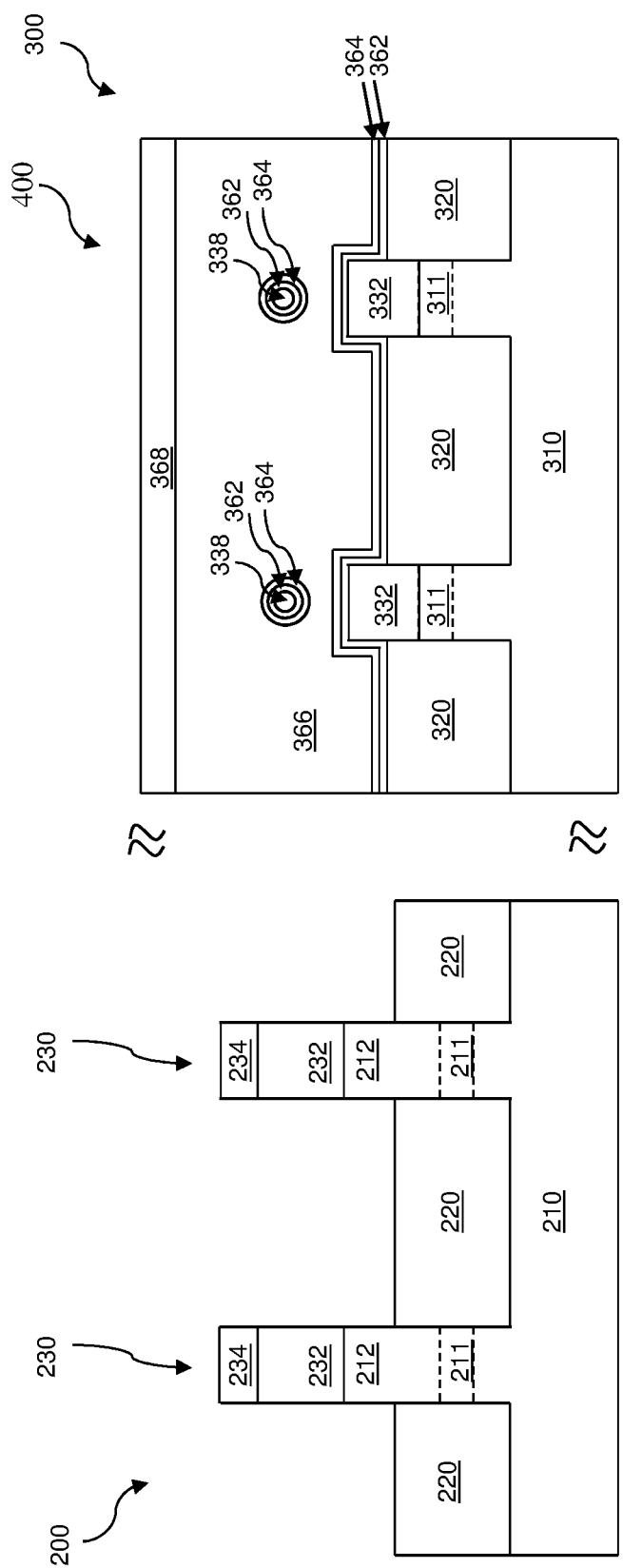
Figure 10B:
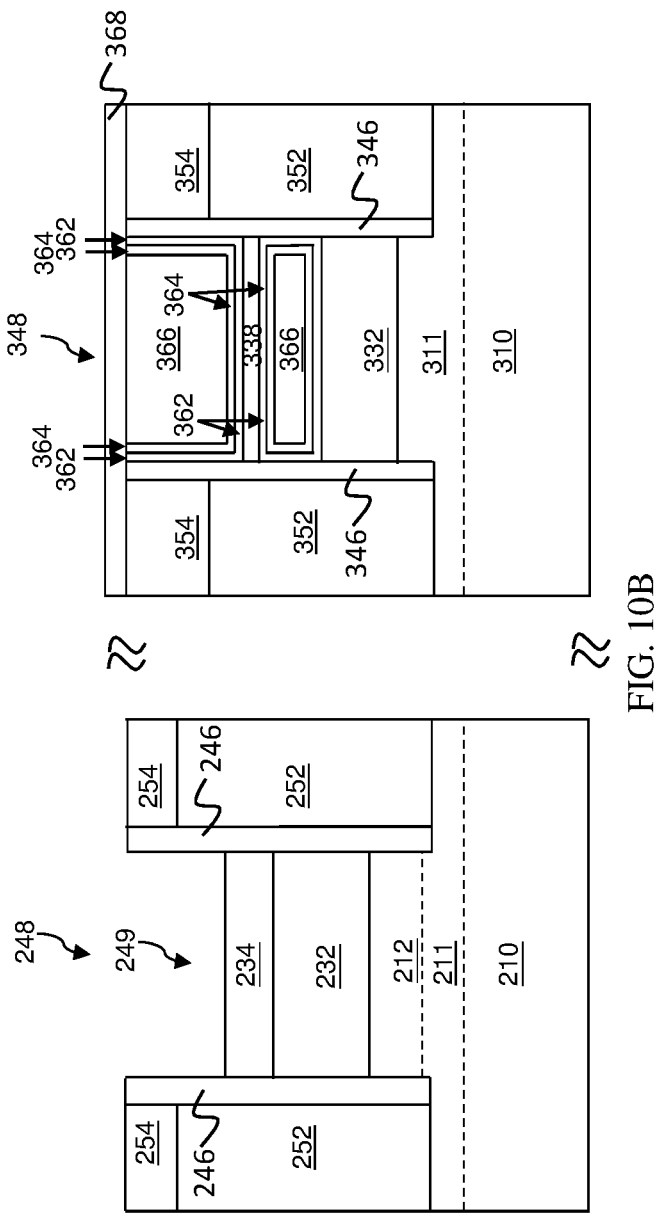

Referring to FIGS. 1 and 10A-10B, method 100 proceeds to step 120 by forming a hard mask 368 over PMOS region 300 to prevent PMOS region 300 from being affected during the following processes of NMOS region 200. Hard mask 368 may include silicon oxide, silicon nitride, silicon oxynitride, or any other suitable dielectric material. Hard mask 368 may include a single layer or multiple layers. Hard mask 368 may be formed by thermal oxidation, chemical oxidation, ALD, or any other appropriate method.

Still referring to FIGS. 10A-10B, in some embodiments at step 120, dummy gate 242 may be removed to expose gate stack 249 in gate region 248 of NMOS region 200. Dummy gate 242 may be removed using any appropriate method, such as etching processes. Gate stack 249 may include the first layer 232 and the second layer 234. The etching processes may include selective wet etch or selective dry etch, such that dummy gate 242 has an adequate etch selectivity with respect to gate stack 249, and the sidewall spacers 246. Alternatively, dummy gate 242 may be recessed by a series of processes including photolithography patterning and etching back.

Figure 11A:
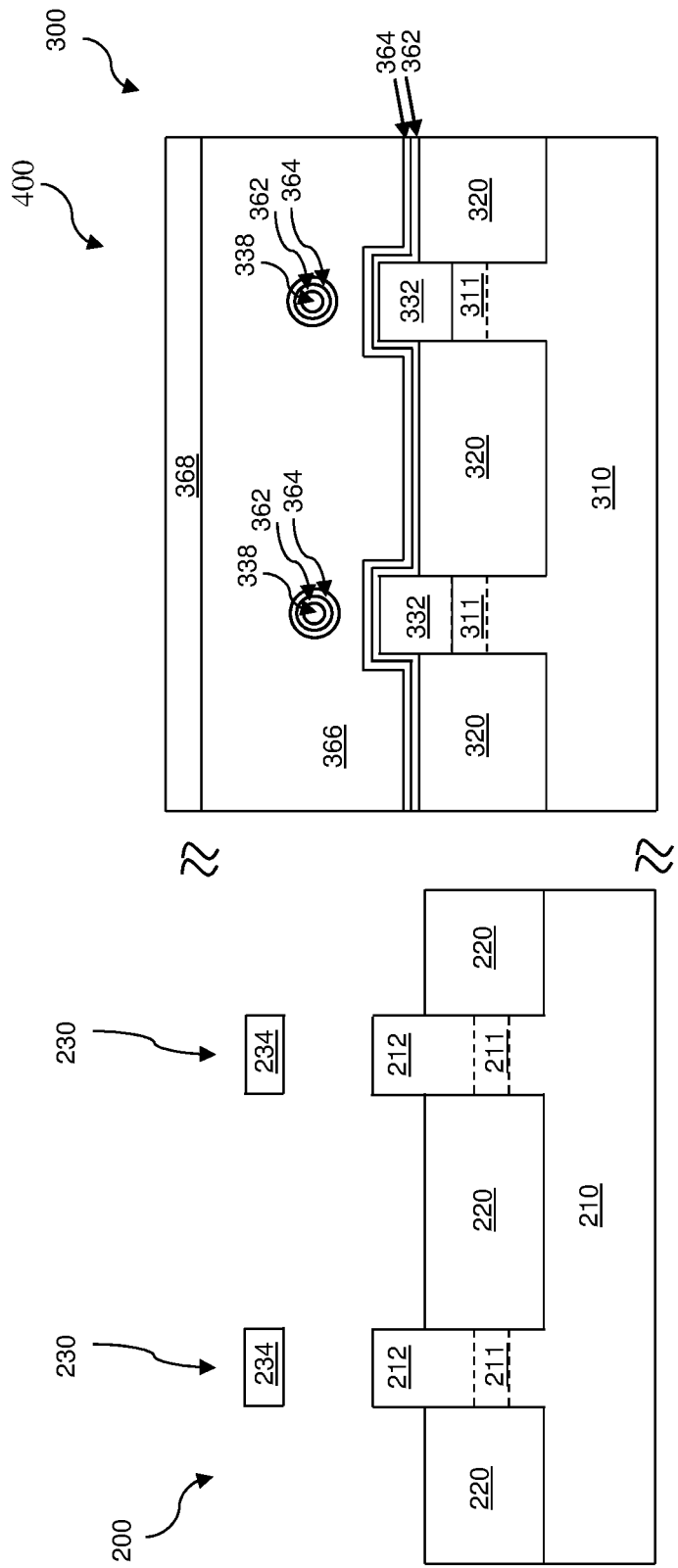
Figure 11B:
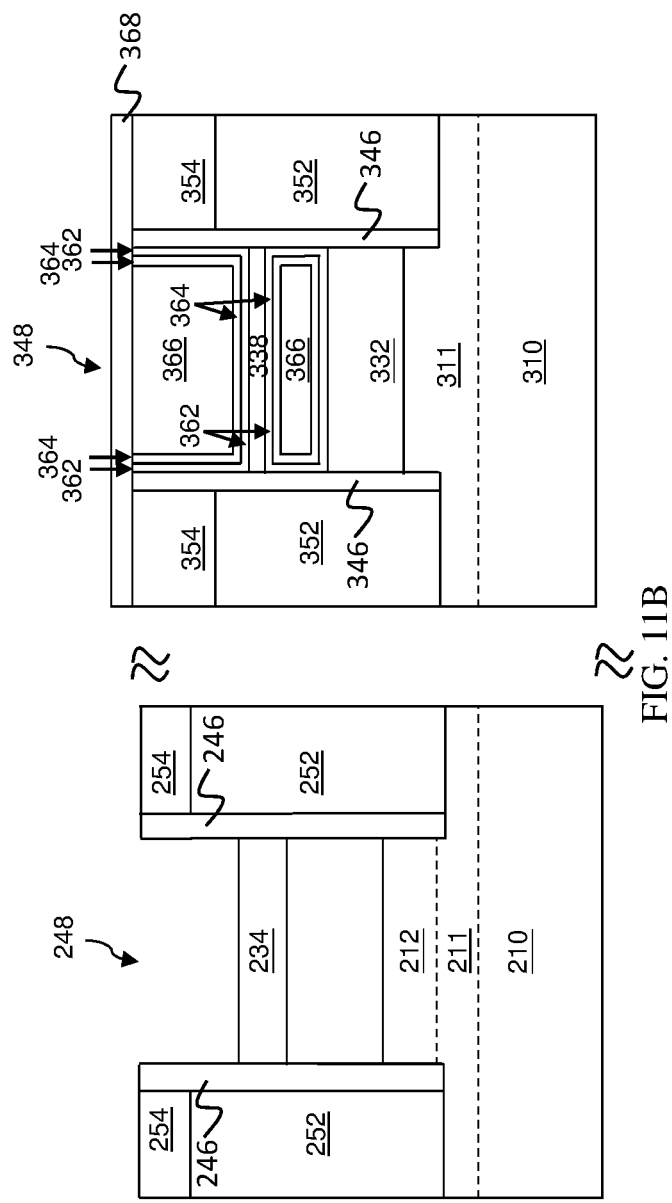

Referring to FIGS. 1 and 11A-11B, method 100 proceeds to step 122 by selectively removing the first layer 232 of NMOS region 200. In some embodiments, the first layer 232 may include SiGe, and the SiGe may be removed using any appropriate etching process, such as dry etching process, wet etching process, and/or combination thereof. The removing process of the first layer 232 may also include a selective wet etch or a selective dry etch, such that it offers adequate etch selectivity with respect to the second layer 234. In some examples, the selective wet etch or the selective dry etch may selectively remove the entire first layer 232, and leave the entire or portions of the second layer 234. The dry and wet etching processes may have etching parameters that can be tuned, such as etchants used, etching temperature, etching solution concentration, etching pressure, source power, RF bias voltage, RF bias power, etchant flow rate, and other suitable parameters. Dry etching processes may include a biased plasma etching process that uses a chlorine-based chemistry. Other dry etchant gasses may include Tetrafluoromethane ($CF_4$), nitrogen trifluoride ($NF_3$), sulfur hexafluoride ($SF_6$), and helium (He), and Chlorine trifluoride ($ClF_3$). Dry etching may also be performed anisotropically using such mechanisms as DRIE (deep reactive-ion etching). Chemical vapor etching may be used as a selective etching method, and the etching gas may include hydrogen chloride (HCl), Tetrafluoromethane ($CF_4$), and gas mixture with hydrogen ($H_2$). Chemical vapor etching may be performed by Chemical Vapor Deposition (CVD) with suitable pressure and temperature.

Figure 12A:
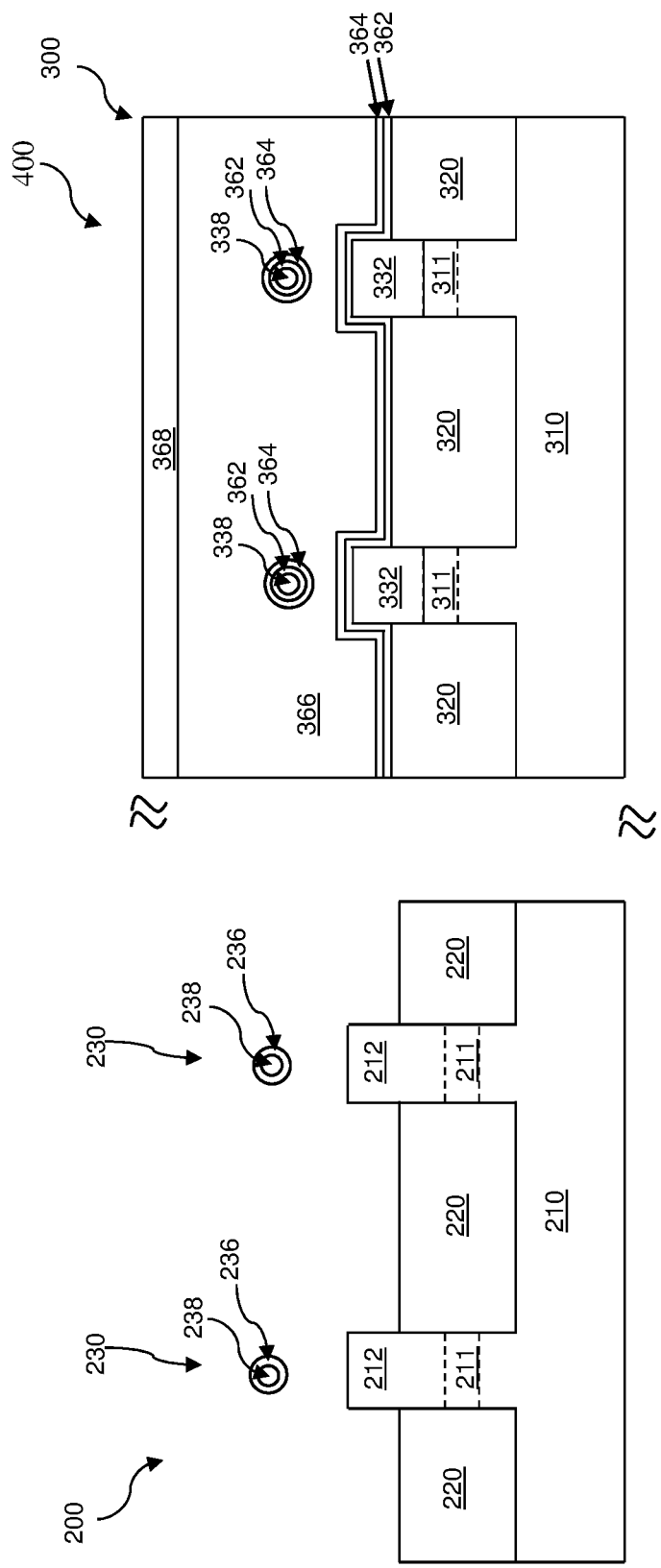
Figure 12B:
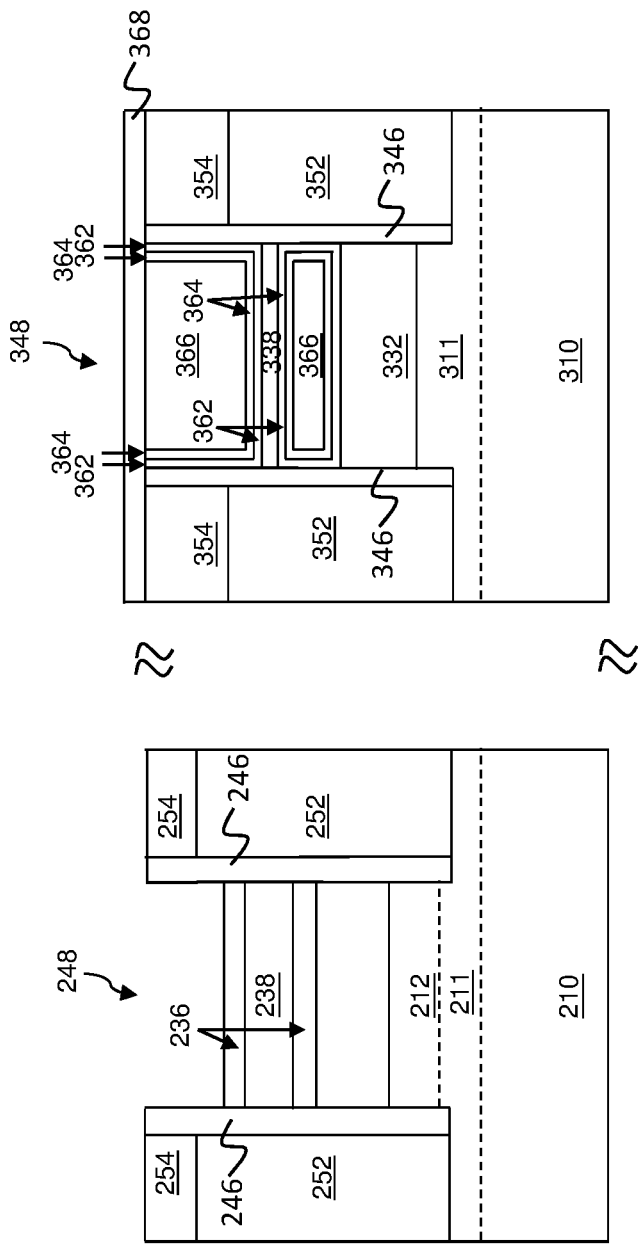

Referring to FIGS. 1 and 12A-12B, method 100 proceeds to step 124 by oxidizing portions of gate region 248 in NMOS region 200 to form an outer oxide layer 236 and an inner nanowire 238. In some embodiments, an outer portion of the second layer 234 of the semiconductor layer stacks 230 may be oxidized to form the outer oxide layer 236. In some examples, the thermal oxidation process is conducted in oxygen ambient. In some examples, the thermal oxidation process may be conducted in a combination of steam ambient and oxygen ambient. The thermal oxidation process may be conducted in a combination of steam ambient and oxygen ambient with one atmospheric pressure and a temperature in a range from 400° C. to 600° C. The thermal oxidation process may be conducted for 30-180 minutes. During the thermal oxidation process, an outer portion of the second layer 234 may be oxidized to form an outer oxide layer 236. In some embodiments, the outer semiconductor oxide layer 236 may include silicon oxide ($SiO_x$), where x is oxygen composition in atomic percent. In some embodiments, an inner portion of the second layer 234 may diffuse to the center of the upper portion of gate region 248 to form a semiconductor core 238 during the oxidation process. Semiconductor core portion 238 may be continuously along the line B-B, and connected to the source/drain features 252 on both sides of gate region 248. It is noted that the following discussion will now refer to semiconductor core portion 238 as an inner semiconductor nanowire 238. In some embodiments, the inner semiconductor nanowire 238 may be Si nanowire 238. The outer oxide layer 236 may be formed to wrap the inner semiconductor nanowire 338.

Referring to FIGS. 12A-12B, in some examples, the diameter of the semiconductor nanowire 238 may be in the range of 2-13 nm. The size and shape of the outer semiconductor oxide layer 236 and/or the inner semiconductor nanowire 238 may vary with different process conditions, such as thermal oxidation temperature and time.

Figure 13A:
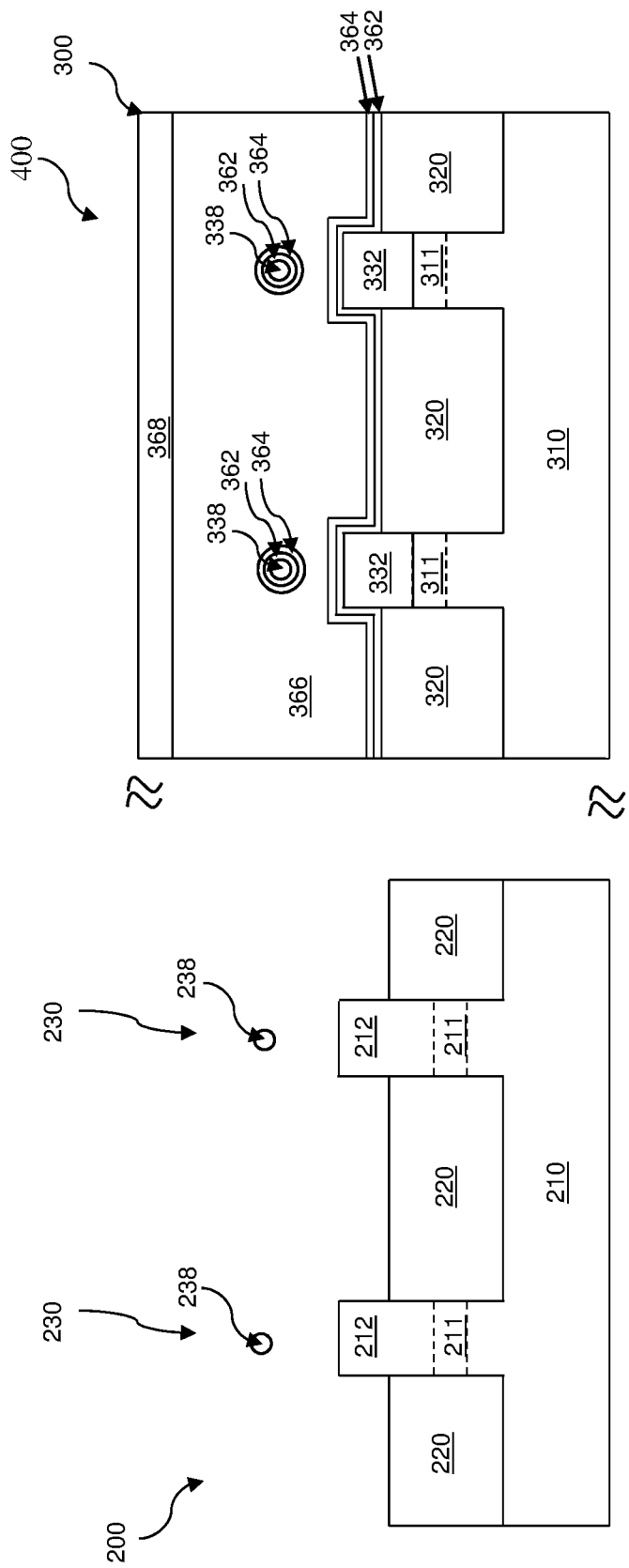
Figure 13B:
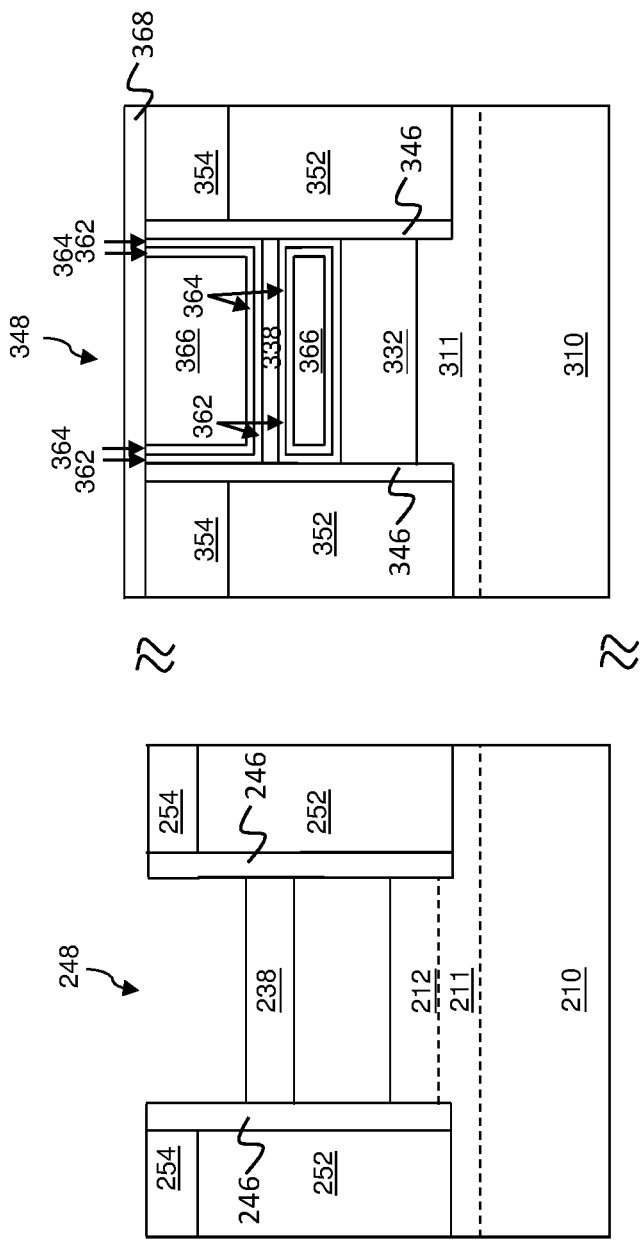

Referring to FIGS. 1 and 13A-13B, method 100 proceeds to step 126 by removing the outer oxide layer 236 to expose inner nanowire 238 in NMOS region 200. The removing process may include a dry etch, a wet etch, or a combination of. For example, a selective wet etch or a selective dry etch of outer oxide layer 236 is performed with adequate etch selectivity with respect to inner nanowire 238. Gate region 248 of NMOS 200 is configured to include inner nanowire 238 and fin structure 212. In some embodiments, fin structure 212 is the upper portion of the substrate 210.

Figure 14A:
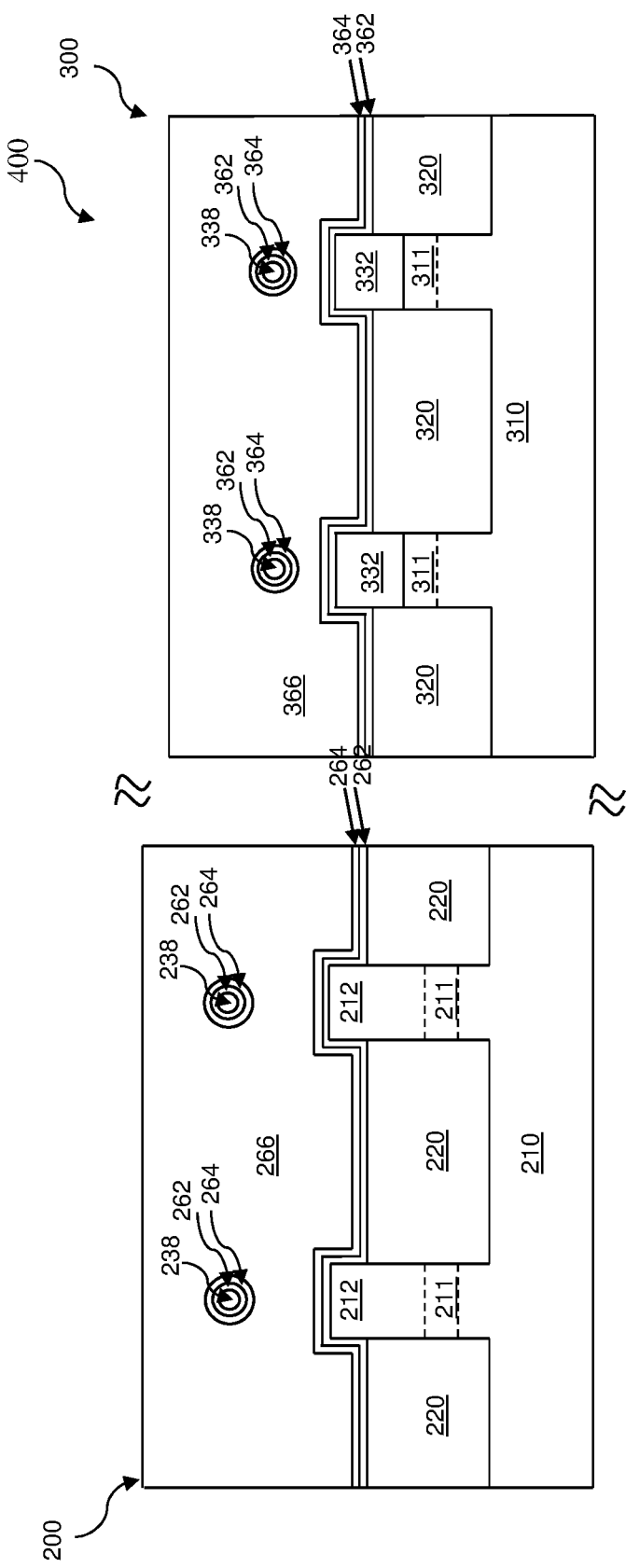
Figure 14B:
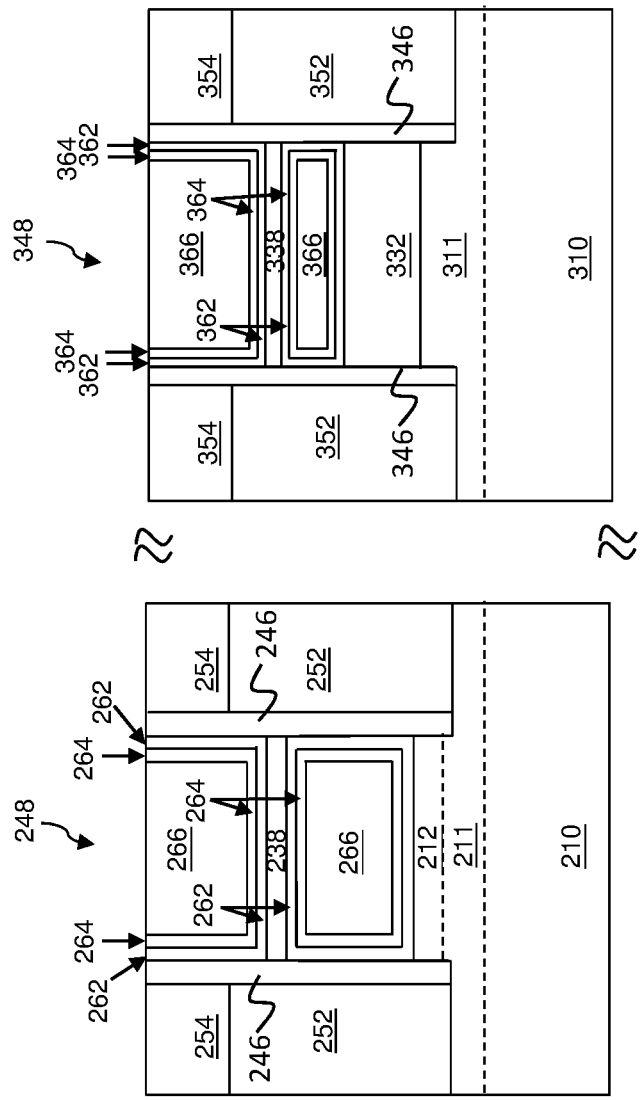

Referring to FIGS. 1 and 14A-14B, method 100 proceeds to step 128 by forming interfacial layer (IL) 262/high-k (HK) layer 264/metal gate (MG) 266 in NMOS region 200. One or more ILs 262 may be formed to wrap around inner nanowire 238, and cover fin structure 212 and sidewall spacers 246. One or more HK layers 264 may be deposited over and wrapping around IL 262. The formation processes and materials used to form IL 262, HK dielectric layer 264 and MG layer 266 may be substantially similar to the formation processes and materials used to form IL 362, HK dielectric layer 364 and MG layer 366, as described in FIGS. 9A-9B. In some embodiments, the interface between the IL 262 and the isolation region 220 may not be observed after the thermal treatment. The interface between the IL 262 and the HK dielectric layer 264 may not be observed after the thermal treatment. After depositing IL 262/HK layer 264/MG 266, gate region 248 may include fin structure 212, inner semiconductor nanowire 238, and IL 262/HK layer 264/MG 266.

Still referring to FIGS. 1 and 14A-14B, at step 128, hard mask 368 covering PMOS region 300 may be removed. In some embodiments, hard mask 368 may be removed during the planarization of the surface of NMOS region 200 using a CMP process.

Although according to the illustrations in FIGS. 3-14, the nanowire and the fin structure in PMOS region 300 are formed prior to the formation of the nanowire and the fin structure in NMOS region 200, the nanowire and the fin structure in NMOS region 200 may be formed prior to the formation of the nanowire and the fin structure in PMOS region 300. In some embodiments, a hard mask may be first formed to cover PMOS region 300 during the formation of the nanowire and the fin structure in NMOS region 200. In some embodiments, the nanowire and the fin structure may be only formed in NMOS region 200. In some embodiments, the nanowire and the fin structure may be only formed in PMOS region 300. A person having ordinary skill in the art would be able to understand that NMOS region 200 and PMOS region 300 may be formed using any suitable processes in any appropriate order and in any proper topology.

Although only one nanowire is illustrated in NMOS region 200, and only one nanowire is illustrated in PMOS region 300, NMOS region 200 and/or PMOS region 300 may include more than one nanowire. In some embodiments, NMOS region 200 and/or PMOS region 300 may include more than one fin structure. A person having ordinary skill in the art would be able to understand that any number of nanowires and/or any number of fin structures may be included in NMOS region 200 and/or PMOS region 300 in any suitable arrangement.

In some embodiments, MG layer 266 of NMOS region 200 may also include a first capping layer wrapping around IL 262/HK layer 264 structure. A first barrier MG and n-type work function (NWF) MG may be further formed to wrap around the first capping layer. MG layer 366 of PMOS region 300 may also include a second capping layer wrapping around IL 362/HK layer 364 structure. A second barrier MG and p-type work function (PWF) MG may be further formed to wrap around the second capping layer. The first and/or second capping layer may include TiN. The first and/or second barrier MG may include TaN. The NWF MG of NMOS region 200 may be formed using different metal layers from the PWF MG layer of PMOS region 300. In some examples, the NWF MG may include TiAlC, TaAl, and/or TiAl. The PWF MG may include TiN.

Although the source/drain features 252 and/or 352 and source/drain recessing trenches 251 and/or 351 are illustrated in individual type separated by isolation regions 220 and/or 320, the source/drain recessing trenches 251 and/or 351 may be formed as common source/drain recessing trenches, and the source/drain features 252 and/or 352 may be formed using any suitable processes in any proper shape, such as crown-shaped source/drain features.

NMOS region 200 and/or PMOS region 300 of IC device 400 may undergo further CMOS or MOS technology processing to form various features and regions known in the art. For example, subsequent processing may form various contacts/vias/lines and multilayers interconnect features (e.g., metal layers and interlayer dielectrics) on substrate 210 and/or 310, configured to connect the various features or structures of IC device 400. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after method 100, and some of the steps described can be replaced or eliminated for other embodiments of the method.

The present disclosure provides many different embodiments of a method for fabricating an integrated circuit (IC) device. The method includes providing a precursor. The precursor includes a substrate having a first metal-oxide-semiconductor (MOS) region and a second MOS region; first gate region, source/drain regions and isolation region formed in the first MOS region, the first gate region including a first semiconductor layer stack; and second gate region, source/drain regions and isolation region formed in the second MOS region, the second gate region including a second semiconductor layer stack. The method further includes recessing the first isolation region to laterally expose the first semiconductor layer stack in the first gate region; oxidizing first semiconductor layer stack to form first outer oxide layer and inner nanowire, the first inner nanowire extending from the first source region to the first drain region; removing the first outer oxide layer to expose the first inner nanowire in the first gate region; forming a first high-k/metal gate (HK/MG) stack wrapping around the first inner nanowire; recessing the second isolation region to laterally expose the second semiconductor layer stack in the second gate region; oxidizing the second semiconductor layer stack to form second outer oxide layer and inner nanowire, the second inner nanowire extending from the second source region to the second drain region; removing the second outer oxide layer to expose the second inner nanowire in the second gate region; and forming a second HK/MG stack wrapping around the second inner nanowire.

In another embodiment, an IC device includes a substrate having an N-type metal-oxide-semiconductor (NMOS) region and a P-type metal-oxide-semiconductor (PMOS) region; a first gate region, and first source/drain features separated by the first gate region in the NMOS region; and a second gate region, and second source/drain features separated by the second gate region in the PMOS region. The first gate region includes a first fin structure and a first nanowire over the first fin structure. The first nanowire includes a first semiconductor material and extends from the first source feature to the first drain feature. The second gate region includes a second fin structure and a second nanowire over the second fin structure. The second nanowire includes a second semiconductor material and extends from the second source feature to the second drain feature.

In yet another embodiment, an IC device includes a substrate including a metal-oxide-semiconductor (MOS) region; a gate region disposed over the substrate; and source/drain features separated by the gate region. The gate region includes a fin structure; and a nanowire formed over the fin structure. The nanowire extends from a source feature to a corresponding drain feature. The nanowire includes a semiconductor material selected from a group consisting of Si and SiGe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a fin structure extending from a substrate and formed of a first semiconductor material;
    a first source/drain feature and a second source/drain feature disposed over the substrate;
    a nanowire disposed over the fin structure, the nanowire extending between the first and second source/drain features;
    a second semiconductor material layer disposed directly on the fin structure and below the nanowire, the second semiconductor material layer comprising a second semiconductor material different than the first semiconductor material and having a top surface facing away from the substrate;
    a gate dielectric layer disposed directly on the top surface and two sidewall surfaces of the second semiconductor material layer; and
    a gate electrode layer disposed over the gate dielectric layer.

2. The device of claim 1, wherein the substrate is formed of the first semiconductor material.

3. The device of claim 1, wherein the nanowire includes silicon.

4. The device of claim 1, wherein the nanowire includes germanium.

5. The device of claim 1, further comprising an anti-punch through feature disposed in the fin structure.

6. The device of claim 1, further comprising a sidewall spacer disposed between the fin structure and the first source/drain feature, wherein the nanowire extends to the sidewall spacer.

7. The device of claim 1, wherein the gate dielectric layer is disposed directly on the nanowire.

8. A device comprising:
a substrate having a first region and a second region;
a first fin structure disposed over the first region, the first fin structure extending from the substrate and being formed of a first semiconductor material;
a first nanowire disposed over the first fin structure, the first nanowire including a second semiconductor material;
a second fin structure disposed over the second region, the second fin structure extending from the substrate;
a second nanowire disposed over the second fin structure, the second nanowire including a third semiconductor material;
a fourth semiconductor material layer disposed directly on the first fin structure, the fourth semiconductor material layer comprising a fourth semiconductor material different than the first semiconductor material and having a top surface facing away from the substrate;
a gate dielectric layer disposed directly on the top surface and two sidewall surfaces of the fourth semiconductor material layer; and
a gate electrode layer disposed over the gate dielectric layer.

9. The device of claim 8, wherein the first fin structure is associated with a first-type of transistor and the second fin structure is associated with a second-type transistor, the first-type being opposite the second-type.

10. The device of claim 8, wherein the first semiconductor material includes silicon, and
wherein the second semiconductor material includes germanium.

11. The device of claim 10, wherein the third semiconductor material includes germanium, and
wherein the fourth semiconductor material includes silicon germanium.

12. The device of claim 8, further comprising:
a first anti-punch through feature at least partially disposed in the first fin structure and including a first-type of dopant; and
a second anti-punch through feature at least partially disposed in the second fin structure and including a second-type of dopant, the second-type being opposite the first-type.

13. The device of claim 8, further comprising another gate electrode layer disposed over second nanowire, the another gate electrode layer being formed of a first-type work function metal layer; and
wherein the gate electrode layer is formed of a second-type work function metal layer, the second-type being opposite the first-type.

14. A device comprising:
a fin structure extending from a substrate and being formed of a first semiconductor material;
a second semiconductor material layer disposed directly on the fin structure, the second semiconductor material layer comprising a second semiconductor material different than the first semiconductor material and having a top surface facing away from the substrate;
a nanowire disposed over the second semiconductor material layer;
a gate dielectric layer disposed directly on the top surface and sidewall surfaces of the second semiconductor material layer;
a gate electrode layer disposed over the gate dielectric layer; and
a sidewall spacer extending along a sidewall of the second semiconductor material layer such that the sidewall spacer physically contacts the sidewall of the second semiconductor material layer.

15. The device of claim 14, wherein the nanowire includes germanium.

16. The device of claim 14, wherein the substrate is formed of the first semiconductor material.

17. The device of claim 14, further comprising an anti-punch through feature disposed in at least a portion of the fin structure and a portion of the substrate.

18. The device of claim 14, wherein the nanowire has a top surface facing away from the substrate and a bottom surface facing the substrate, and
wherein the gate dielectric layer is disposed directly on the top surface of the nanowire and the bottom surface of the nanowire.

19. The device of claim 1, further comprising an interlayer dielectric layer disposed over the first source/drain feature, the interlayer dielectric layer having a top surface facing away from the substrate,
wherein the gate dielectric layer includes a top surface facing away from the substrate,
wherein the gate electrode layer includes a top surface facing away from the substrate,
wherein the respective top surfaces of the interlayer dielectric layer, gate dielectric layer and the gate electrode are coplanar with respect to each other.

20. The device of claim 6, wherein the sidewall spacer extends from the substrate such that the sidewall spacer physically contacts the substrate, and
wherein the sidewall spacer extends along a sidewall of the fin structure and a sidewall of the gate dielectric layer such that the sidewall spacer physically contacts the sidewall of the fin structure and the sidewall of the gate dielectric layer.

* * * * *